United States Patent
Al-Aghbari et al.

(10) Patent No.: US 11,120,188 B2
(45) Date of Patent: Sep. 14, 2021

(54) FPGA VIRTUALIZATION

(71) Applicant: KING FAHD UNIVERSITY OF PETROLEUM AND MINERALS, Dhahran (SA)

(72) Inventors: Amran A. Al-Aghbari, Dhahran (SA); Muhammad E. S. Elrabaa, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 16/259,490

(22) Filed: Jan. 28, 2019

(65) Prior Publication Data
US 2020/0241899 A1    Jul. 30, 2020

(51) Int. Cl.
| | |
|---|---|
| *G06F 30/00* | (2020.01) |
| *G06F 30/34* | (2020.01) |
| *G06F 9/455* | (2018.01) |
| *H04L 29/08* | (2006.01) |
| *H03K 19/17752* | (2020.01) |
| *H03K 19/17736* | (2020.01) |
| *H03K 19/17728* | (2020.01) |

(52) U.S. Cl.
CPC .............. *G06F 30/34* (2020.01); *G06F 9/455* (2013.01); *H03K 19/17728* (2013.01); *H03K 19/17736* (2013.01); *H03K 19/17752* (2013.01); *H04L 67/34* (2013.01)

(58) Field of Classification Search
CPC ......... G06F 30/34; G06F 9/455; H04L 67/34; H03K 19/17728; H03K 19/17736; H03K 19/17752
See application file for complete search history.

(56) References Cited

U.S. PATENT DOCUMENTS

| | | | | |
|---|---|---|---|---|
| 4,723,120 A | * | 2/1988 | Petty, Jr. | ................ H04L 12/00 370/221 |
| 5,754,764 A | * | 5/1998 | Davis | .................... G06F 13/385 709/200 |
| 7,085,683 B2 | * | 8/2006 | Anderson | ........... G06F 11/3447 702/186 |
| 9,455,901 B2 | * | 9/2016 | Davie | ..................... H04L 12/46 |
| 10,338,135 B2 | * | 7/2019 | Davis | ................. G01R 31/2884 |
| 10,348,308 B2 | * | 7/2019 | Natu | ................ H03K 19/17724 |
| 10,628,225 B2 | * | 4/2020 | Yamato | ................. G06F 9/5044 |
| 2013/0145431 A1 | * | 6/2013 | Kruglick | ................. H04L 63/08 726/4 |
| 2015/0169376 A1 | | 6/2015 | Chang et al. | |

(Continued)

OTHER PUBLICATIONS

Byma et al.; "FPGAs in the Cloud: Booting Virtualized Hardware Accelerators with OpenStack"; 2014; IEEE 22nd International Symposium on Field-Programmable Custom Computing Machines; pp. 109-116.*

(Continued)

*Primary Examiner* — Naum Levin
(74) *Attorney, Agent, or Firm* — Oblon, McClelland, Maier & Neustadt, L.L.P.

(57) ABSTRACT

An FPGA virtualization platform including a network controller configured to provide an interface to an external network; a static logic section coupled to the network controller; and one or more reconfigurable regions each having a virtualized field programmable gate array vFPGA) that includes a wrapper and a user design.

13 Claims, 18 Drawing Sheets

(56) References Cited

U.S. PATENT DOCUMENTS

| | | | |
|---|---|---|---|
| 2015/0350102 A1* | 12/2015 | Leon-Garcia | H04L 47/781 709/226 |
| 2017/0195173 A1 | 7/2017 | Izenberg et al. | |
| 2018/0054359 A1 | 2/2018 | Abel et al. | |
| 2018/0196951 A1 | 7/2018 | Hoppert | |
| 2019/0004871 A1* | 1/2019 | Sukhomlinov | G06F 9/541 |

OTHER PUBLICATIONS

Mikhail Asiatici, et al., "Virtualized Execution Runtime for FPGA Accelerators in the Cloud", IEEE Access, vol. 5, Feb. 2, 2017, pp. 1900-1910.

Suhaib A. Fahmy, et al., "Virtualized FPGA Accelerators for Efficient Cloud Computing", IEEE 7th International Conference on Cloud Computing Technology and Science, 2015, pp. 430-435.

Fei Chen, et al., "FPGA Accelerator Virtualization in an OpenPOWER cloud", OpenPOWER™ Summit, Mar. 17-19, 2015, 13 pages.

Kenneth Pocek, et al., "Birth and Adolescence of Reconfigurable Computing: A Survey of the First 20 Years of Field-Programmable Custom Computing Machines", IEEE 21st Annual International Symposium on Field-Programmable Custom Computing Machines Commemorative Book, Apr. 28-30, 2013, pp. 3-19.

Christoforos Kachris, et al., "A Survey on Reconfigurable Accelerators for Cloud Computing" IEEE 26th International Conference on Field Programmable Logic and Applications (FPL). 2016, 10 pages.

Andrew Putnam, et al., "A Reconfigurable Fabric for Accelerating Large-Scale Datacenter Services", IEEE 41st Annual International Symposium on Computer Architecture, (ISCA), Jun. 2014, pp. 13-24.

Andrew Putnam, et al., "A Reconfigurable Fabric for Accelerating Large-Scale Datacenter Services", IEEE Micro, vol. 35, No. 3, May-Jun. 2015, pp. 10-22.

Naif Tarafdar, et al., "Designing for FPGAs in the Cloud", IEEE Design & Test, vol. 35. No. 1, 2017, 6 pages.

Matthew Jacobsen, et al., "RIFFA 2.1: A Reusable Integration Framework for FPGA Accelerators", ACM Transactions on Reconfigurable Technology and Systems vol. 8, No. 4, Article 22, Sep. 2015, 23 pages.

Kizheppatt Vipin, et al., "DyRACT: A Partial Reconfiguration Enabled Accelerator and Test Platform", IEEE 24th International Conference on Field Programmable Logic and Applications (FPL), 2014, 7 pages.

Fei Chen, et al., "Enabling FPGAs in the Cloud", Proceedings of the 11th ACM Conference on Computing Frontiers, Article 3, 2014, 10 pages.

Stuart Byma, et al., "FPGAs in the Cloud: Booting Virtualized Hardware Accelerators with OpenStack", IEEE 22nd Annual International Symposium on Field-Programmable Custom Computing Machines, 2014, pp. 109-116.

Jagath Weerasinghe, et al., "Enabling FPGAs in Hyperscale Data Centers", IEEE 12th Int. Conf. on Ubiquitous Intelligence and Computing and IEEE 12th Intl Conf. on Autonomic and Trusted Computing and 15th Intl Conf. on Scalable Computing and Communications (UEC-ATC-SCALCOM-CBDCOM-IOP), 2015, pp. 1078-1086.

Jagath Weerasinghe, et al., "Disaggregated FPGAs: Network Performance Comparison Against Bare-Metal Servers, Virtual Machines and Linux Containers", IEEE 8th International Conference on Cloud Computing Technology and Science, Cloudcom, 2016, pp. 9-17.

Hayden Kwok-Hay So, et al., "FPGA Overlays", FPGA for Software Programmers, 2016, pp. 285-305.

Robert Kirchgessner, et al., "VirtualRC: A Virtual FPGA Platform for Applications and Tools Portability", Proceedings of the ACM/SIGDA 20th International Symposium on Field Programmable Gate Arrays (FPGA), Feb. 2012, pp. 205-208.

"AMBA® 4 AXI4-Stream Protocol Specification", ARM, http://infocenter.arm.com/help/index.jsp?topic=/com.arm.doc.ihi0051a/index.html, Version: 1.0, Issue A, Mar. 3, 2010, 42 pages.

Charalampos Vatsolakis, et al., "RACOS: Transparent Access and Virtualization of Reconfigurable Hardware Accelerators", IEEE International Conference on Embedded Computer Systems: Architectures, Modeling, and Simulation (SAMOS), 2017, pp. 11-19.

Esam El-Araby, et al., "Virtualizing and Sharing Reconfigurable Resources in High-Performance Reconfigurable Computing Systems", Second International Workshop on High-Performance Reconfigurable Computing Technology and Applications, 2008, 8 pages.

Dimitris Theodoropoulos, et al., "Multi-FPGA Evaluation Platform for Disaggregated Computing", IEEE 25th Annual International Symposium on Field-Programmable Custom Computing Machines, 2017, p. 193.

Duy Viet Vu, et al., "Enabling Partial Reconfiguration for Coprocessors in Mixed Criticality Multicore Systems Using PCI Express Single-Root I/O Virtualization", IEEE International Conference on Reconfigurable Computing and FPGAS (Reconfig14), 2014, 6 pages.

Oliver Sander, et al., "A Flexible Interface Architecture for Reconfigurable Coprocessors in Embedded Multicore Systems using PCIe Single-Root I/O Virtualization", IEEE International Conference on Field-Programmable Technology (FPT), 2014, pp. 223-226.

Andreas Ange, et al., "ReconOS: An Operating System Approach for Reconfigurable Computing", IEEE Micro, vol. 34, Issue 1. Jan./Feb. 2014, pp. 60-71.

Dimitris Theodoropoulos, et al., "FPGA-based Evaluation Platform for Disaggregated Computing", International Conference on Embedded Computer Systems: Architectures, Modeling, and Simulation (SAMOS), 2017, pp. 129-136.

"AMBA® AXI™ and ACE™ Protocol Specification", ARM. http://infocenter.arm.com/help/index.jsp?topic=/com.arm.doc.ihi0051a/index.html, AXI3™, AXI4™, and AXI4-Lite™ Ace and Ace-Lite™, 2003, 2004, 2010, 2011, 302 pages.

International Search Report and Written Opinion dated Jun. 16, 2020 in PCT/IB2020/000072, 16 pages.

Al-Aghbari Amran et al., "A Platform for FPGA Virtualization in Clouds and Data Centers", Microprocessors and Microsystems, Ipc Business Press Ltd. London, GB, vol. 62, XP085445418, Jul. 26, 2018, pp. 61-71.

Weerasinghe Jagath et al., "Network-attached FPGAs for Data Center Applications", 2016 International Conference on Field-Programmable Technology (FPT), IEEE, XP033098823, 7 Dec. 7, 2016, 8 pages.

* cited by examiner

```
Mask = 28'h7FFFFFF;
CLK_Counter = 28'h0;
rst = 1'b1;
enable = 1'b0;
end_of_file_signal = 1'b0;
#10; rst = 1'b0;
For (j=0; j<100; j++) begin
 enable = 1'b1;
 for(i=0; i<63; i++) begin
  data = read_data();
  #10;
 end
 #130;
 enable = 1'b0;
 #10;
end
```

FPGA VIRTUALIZATION

STATEMENT REGARDING PRIOR DISCLOSURES BY THE INVENTORS

Aspects of this technology were disclosed in Al-Aghbari, Amran, and Elrabaa, Muhammad E. S., *A Platform for FPGA Virtualization in Clouds and Data Centers*, Microprocessors and Microsystems, Volume 62, October 2018, Pages 61-71, which is incorporated herein by reference in its entirety.

STATEMENT OF ACKNOWLEDGEMENT

This work was supported by the National Plan for Science, Technology and Innovation (Maarifah)—King Abdulaziz City for Science and Technology—through the Science & Technology Unit at the King Fahd University of Petroleum & Minerals, the Kingdom of Saudi Arabia, under Grant #12-INF3015-04.

BACKGROUND

Technical Field

The present disclosure is directed generally to programmable logic devices, and, more particularly, to a field programmable gate arrays (FPGA) virtualization platform and associated methods.

Background

Two common approaches have emerged for attaching FPGAs to Data Centers (DCs): (i) as accelerators attached to compute nodes via a local bus such as the PCIe (see, e.g., C. Kachris and D. Soudris, "A survey on reconfigurable accelerators for cloud computing," Proc. IEEE 26th Int. Conf. Field Programmable Logic and Applications (FPL), pp. 1-10, 2016; A. Putnam, et. al., "A reconfigurable fabric for accelerating large-scale datacenter services," Proc. IEEE 41st Annual International Symposium on Computer Architecture (ISCA '14), pp. 13-24, 2014. A. Putnam, et. al., "A Reconfigurable Fabric for Accelerating Large-Scale Datacenter Services," IEEE Micro, Vol. 35, no. 3, pp. 10-22, May-June 2015; N. Tarafdar, N. Eskandari, T. Lin and P. Chow, "Designing for FPGAs in the Cloud," IEEE Design & Test, Vol. 35, no. 1, pp. 23-29; M. Jacobsen, D. Richmond, M. Hogains, and R. Kastner, "RIFFA 2.1: A Reusable Integration Framework for FPGA Accelerators," ACM Trans. Reconfigurable Technol. Syst., Vol. 8, no. 4, 2015; K. Vipin and S. A. Fahmy, "DyRACT: A partial reconfiguration enabled accelerator and test platform," Proc. IEEE 24th International Conference on Field Programmable Logic and Applications (FPL), pp. 1-7, 2014; F. Chen, et al, "Enabling FPGAs in the Cloud," Proc. 11th ACM Conference on Computing Frontiers, Article 3, 2014.), and (ii) as stand-alone independent computing resources connected to the DC's interconnect fabric (S. Byma, et al, "FPGAs in the Cloud: Booting Virtualized Hardware Accelerators with OpenStack," Proc. IEEE 22nd Annual International Symposium on Field-Programmable Custom Computing Machines, pp. 109-116, 2014; J. Weerasinghe, et al, "Enabling FPGAs in Hyperscale Data Centers," Proc. IEEE 12th Int. Conf. Ubiquitous Intelligence and Computing and 12th Intl Conf. on Autonomic and Trusted Computing, and 15th Intl Conf. on Scalable Computing and Communications (UIC-ATC-ScalCom), pp. 1078-1086, 2015; J. Weerasinghe, et al, "Disaggregated FPGAs: Network Performance Comparison Against Bare-Metal Servers, Virtual Machines and Linux Containers," Proc. IEEE Int. Conf. Cloud Computing Technology and Science (CloudCom), pp. 9-17, 2016, each of which is incorporated herein by reference). In the first approach, the FPGA is tightly coupled to a CPU that explicitly initiates and coordinates the computations on the FPGA. This tight coupling between FPGAs and CPUs in compute nodes leads to several limitations; including, the number of FPGAs in a DC is limited to the number of CPU nodes, CPUs must explicitly send/receive data and instructions to the FPGAs wasting both the CPU's and the FPGA's cycles, FPGAs cannot be used as independent computing resources, and, in a cloud setting, customers actually instantiate two compute instances (one on a CPU and another on an FPGA).

Microsoft's Catapult® is one of the most prominent efforts in attaching FPGAs as accelerators to a datacenter's (DC's) servers. (A. Putnam, et. al., "A reconfigurable fabric for accelerating large-scale datacenter services," Proc. IEEE 41st Annual International Symposium on Computer Architecture (ISCA '14), pp. 13-24, 2014; and A. Putnam, et. al., "A Reconfigurable Fabric for Accelerating Large-Scale Datacenter Services," IEEE Micro, Vol. 35, no. 3, pp. 10-22, May-June 2015, each of which is incorporated herein by reference). Each compute node (e.g., server blade) has an FPGA attached to one of the CPU sockets via the PCIe bus. To decouple the number of FPGAs involved in a computation from the number of CPUs, FPGAs form a torus network with SerialLite III links. Each FPGA is connected to three other FPGAs. Several FPGAs can be chained to run several phases of one application and several copies of that application can be launched in parallel. The FPGAs are also connected to the DC's interconnection fabric via a network interface card (NIC). Each FPGA is logically partitioned into two parts; the application's logic (dubbed Role) and the common logic between all applications (dubbed Shell). The shell is mainly responsible for managing data movement from and to the FPGA. The shell implements a bridge to enable passing packets from the torus network and the DC's network (FPGA acts as a bump-in-the-wire between these networks). It also provides a tap for the application logic to alter the network traffic as needed. Catapult is difficult to adapt to different applications. It is optimized for DC-wide applications not individual applications because the interface between the shell and the role is not abstracted and the user should build logic to match the interface. To run multiple user's applications or cloud-based applications, the CPU-FPGA coupling mode would be more convenient.

Tarafdar, et al. proposed a method for attaching FPGAs to virtual machines (VMs) hosted on the DC's CPU via the PCIe bus. (N. Tarafdar, N. Eskandari, T. Lin and P. Chow, "Designing for FPGAs in the Cloud," IEEE Design & Test, Vol. 35, no. 1, pp. 23-29.) Users use Xilinx's SDAccel® to program the FPGA and abstract the VM-FPGA interface, enabling the user to focus on the application logic. OpenCL and Xilinx Hardware Abstraction Layer (HAL) provide the driver calls for the main application on the VM to send/receive data to/from the FPGA and program the Application Region on the FPGA. This means the VM is restricted to run on the machine with the FPGA attached to its PCIe bus.

A framework (SW library) for abstracting the CPU-FPGA communication interface for PCI-attached FPGAs was proposed in M. Jacobsen, D. Richmond, M. Hogains, and R. Kastner, "RIFFA 2.1: A Reusable Integration Framework for FPGA Accelerators," ACM Trans. Reconfigurable Technol. Syst., Vol. 8, no. 4, 2015, which is incorporated herein by reference. Jacobsen et al. described a fixed control logic (e.g., a PCI core and data management logic) that is integrated with every user design. A goal was to let users focus on the application and not the FPGA interfacing challenges. A similar framework was proposed by Vipin et al. (see K. Vipin and S. A. Fahmy, "DyRACT: A partial reconfiguration enabled accelerator and test platform," Proc. IEEE 24th International Conference on Field Programmable Logic and Applications (FPL), pp. 1-7, 2014, which is incorporated herein by reference). Vipin and Fahmy proposed to have the user's logic in a dynamically reconfigurable region. The interface between the control logic and the user's logic consisted of multiple streaming channels with the user logic running at the control logic's frequency. FIFOs are added (as interfaces) within the user's logic in the reconfigurable region.

Another major effort to integrate FPGAs as accelerators was reported in F. Chen, et al, "Enabling FPGAs in the Cloud," Proc. 11th ACM Conference on Computing Frontiers, Article 3, 2014, which is incorporated herein by reference. Multiple virtual FPGAs were tightly coupled with one CPU through a PCIe interface. Multiple processes can be scheduled on the same virtual FPGA (through re-configuration). The user configures a virtual FPGA with a customized accelerator with a custom communication interface. The system can context-switch the same accelerator among users. There is no vitalization at the level of interconnection. Another drawback is that the PCIe interface becomes a bottleneck and its bandwidth must be balanced.

In S. Byma, et al, "FPGAs in the Cloud: Booting Virtualized Hardware Accelerators with OpenStack," Proc. IEEE 22nd Annual International Symposium on Field-Programmable Custom Computing Machines, pp. 109-116, 2014, which is incorporated herein by reference, a method for virtualizing FPGAs to enable their integration in a cloud as standalone compute nodes (e.g., not coupled to a CPU) was introduced. Byma et al. successfully integrated virtual FPGAs into an OpenStack cloud system as Infrastructure-as-a-Service (IaaS). In addition to the Ethernet port, JTAG was used for Virtual FPGA configuration, and a UART was used to control the physical FPGA to configure network address registers. This meant that the FPGA was still attached to a server and results in increased costs of integrating FPGAs into data centers due to excess cabling.

Disaggregated FPGAs (i.e. not tied/attached to a specific server) connected to the DC's network as standalone devices were proposed in J. Weerasinghe, et al, "Enabling FPGAs in Hyperscale Data Centers," Proc. IEEE 12th Int. Conf. Ubiquitous Intelligence and Computing and 12th Intl Conf on Autonomic and Trusted Computing, and 15th Intl Conf. on Scalable Computing and Communications (UIC-ATC-ScalCom), pp. 1078-1086, 2015.; and J. Weerasinghe, et al, "Disaggregated FPGAs: Network Performance Comparison Against Bare-Metal Servers, Virtual Machines and Linux Containers," Proc. IEEE Int. Conf. Cloud Computing Technology and Science (CloudCom), pp. 9-17, 2016., which are incorporated herein by reference. A disaggregated standalone device decoupleed the number of FPGAs from the number servers. However, no abstraction to the FPGA interface was provided. Instead, the off-chip SDRAM was used to implement queues (FIFOs similar to TCP sockets) to store incoming and outgoing data to the FPGA. Users send the data to the off-chip SDRAM, the on-FPGA application reads the data from the SDRAM, perform the computations, and write the results back for the user to read it. That means the application's circuit must be adapted to this specific interface. SW agents running on an embedded CPU (on the FPGA) are used to manage the platform.

Overlay architectures (e.g., those described in H. K-H. So and C. Liu, "FPGA Overlays," In: D. Koch, F. Hannig, and D. Ziener (eds), FPGAs for Software Programmers, Springer, pp. 285-305, 2016; and R. Kirchgessner, G. Stitt, A. George, and H. Lam, "VirtualRC: A Virtual FPGA Platform for Applications and Tools Portability," Proc. ACM/SIGDA International Symposium on Field Programmable Gate Arrays (FPGA'12). pp. 205-208, 2012, which are incorporated herein by reference), including virtual configurable architectures built on top of the FPGA's physical architecture, were proposed to enable fast compilation of applications on FPGAs and allow design portability across many vendors' FPGAs. These overlays both provided HW and interface abstractions. Their main drawbacks are that they are mainly domain-specific and incur huge area and delay overheads that make them inadequate as DC/cloud accelerators.

These abovementioned efforts did not provide a flexible abstract interface to the application's circuitry on the FPGA. In conventional systems designers must spend significant time designing custom interfaces for their circuits. If design changes or additional circuitry are added, the interface would require re-design. Furthermore, typical fine points that apply to circuit design such as clocking and control were not explicitly addressed.

There is a need to truly virtualize FPGAs in DCs and clouds, and abstract their interfaces so that users can design application circuitry without worrying about the interface, instantiate them as independent compute resources, and specify, in metadata, how inputs/control are applied to the circuitry. The specifications should also be independent of the physical FPGA, allowing the application to be ported to different FPGAs.

FPGAs have achieved significant performance gains for many application domains such as cryptography, NP-hard optimizations, pattern matching, floating-point mathematic, and molecular dynamics (K. Pocek, R. Tessier, and A. DeHon, "Birth and adolescence of reconfigurable computing: a survey of the first 20 years of field-programmable custom computing machines," Proc. IEEE 21st Annual International Symposium on Field-Programmable Custom Computing Machines, pp. 1-17, 2013, which is incorporated herein by reference). Their use as computing resources in public/private data centers (DCs) however has been limited by the difficulty of designing or modifying an FPGA-based computing circuit and integrating it with other computing resources (e.g., in a cloud). Integrating an FPGA-based application into a cloud or a DC would involve three main tasks: 1) translating an application to an FPGA circuit (e.g., circuit design), 2) adding a standard communication interface/controller (e.g., 10GE) for communicating with the application, and 3) designing an interface (e.g., wrapper) circuit that formats, applies the inputs (including clocks and control) to the circuit, reads the outputs (including status and error signals), reformats them and sends them to the communication interface. The above tasks are not trivial and may not be easily handled by some application developers (who may be software engineers and not hardware designers). Furthermore, every time the FPGA platform is changed, the application's interface may need to be modified.

Accordingly, in one or more implementations, the present disclosure provides a field programmable gate array virtualization platform having a network controller, a static logic section coupled to the network controller; and one or more reconfigurable regions having a virtualized field programmable gate array (vFPGA) that includes a wrapper and a user design that addresses the above mentioned problems and limitations, among other things.

SUMMARY

The disclosed subject matter proposes a solution to the abstracting problem and introduces an abstraction solution. The disclosed subject matter includes a framework (i.e., methodologies, tools, and platform infrastructure) for virtualizing FPGAs as standalone computing machines in DCs and clouds, fully disaggregated from servers. Physical FPGAs are partitioned into several virtual FPGAs (vFPGAs) with shared communication and management infrastructure (fixed logic). Each vFPGA has a fixed interface to the static logic and can host a different (independent) application design. The interface to the user's design is abstracted via an abstraction layer, and a wrapper generator that generates a wrapper for any hardware design so it can be placed on the vFPGA directly and interface to the fixed logic.

Some implementations can include a field programmable gate array virtualization platform. In some implementations, the platform can include a network controller configured to provide an interface to an external network, a static logic section coupled to the network controller, and one or more reconfigurable regions each having a virtualized field programmable gate array (vFPGA) that includes a wrapper and a user design.

In some implementations, the static logic section can include a clock management section, a routing arbiter, and a reconfiguration management unit. In some implementations, the clock management section generates controllable clock domains for each vFPGA. In some implementations, the reconfiguration management unit can be configured to download a user deign at runtime to one or more vFPGAs.

In some implementations, each vFPGA can be configured to be directly attached to a network via the network controller so as to appear on the network as an independent compute resource to other resources on the network.

In some implementations, the wrapper can include a custom interface for a given user design that provides data, control, and clocking signals and logic for coupling the given user design to the static logic section. In some implementations, each wrapper can be generated by a wrapper generator based on a description file of inputs and outputs of a respective user design. In some implementations, the description file can be one of an extensible mark-up language (XML) file or a data description file in a verification language.

In some implementations, the static logic section can present one or more vFPGA as a server, each with a separate MAC/IP. In some implementations, the static logic section can present the reconfiguration management unit as a separate server.

In some implementations, the network controller can include a transmission control protocol data link, network, and session layers of an OSI network stack. In some implementations, the network controller can establish sessions between vFPGAs and respective clients, and wherein the network controller ensures data ordering and correctness.

In some implementations, the network controller can be configured to receive user data, deliver the user data to the static logic section, and transmit results back to a user associated with the user data. In some implementations, the network controller can be integrated with the static logic section. In some implementations, the network controller can be external to the field programmable gate array virtualization platform. In some implementations, a single network controller can be shared among a plurality of vFPGAs. In some implementations, a network controller can be provided per vFPGA. In some implementations, the static logic section can include data routers configured to route data between the network controller and one or more vFPGA.

In some implementations, the reconfiguration management unit can be configured to receive partial bitstreams over a network to reconfigure one or more vFPGA, wherein the reconfiguration management unit has a dedicated MAC/IP address, and wherein the reconfiguration management unit freezes vFPGA I/O interfaces during configuration or reconfiguration. In some implementations, the reconfiguration management unit can include an internal reconfiguration access port (ICAP) and a wrapper.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
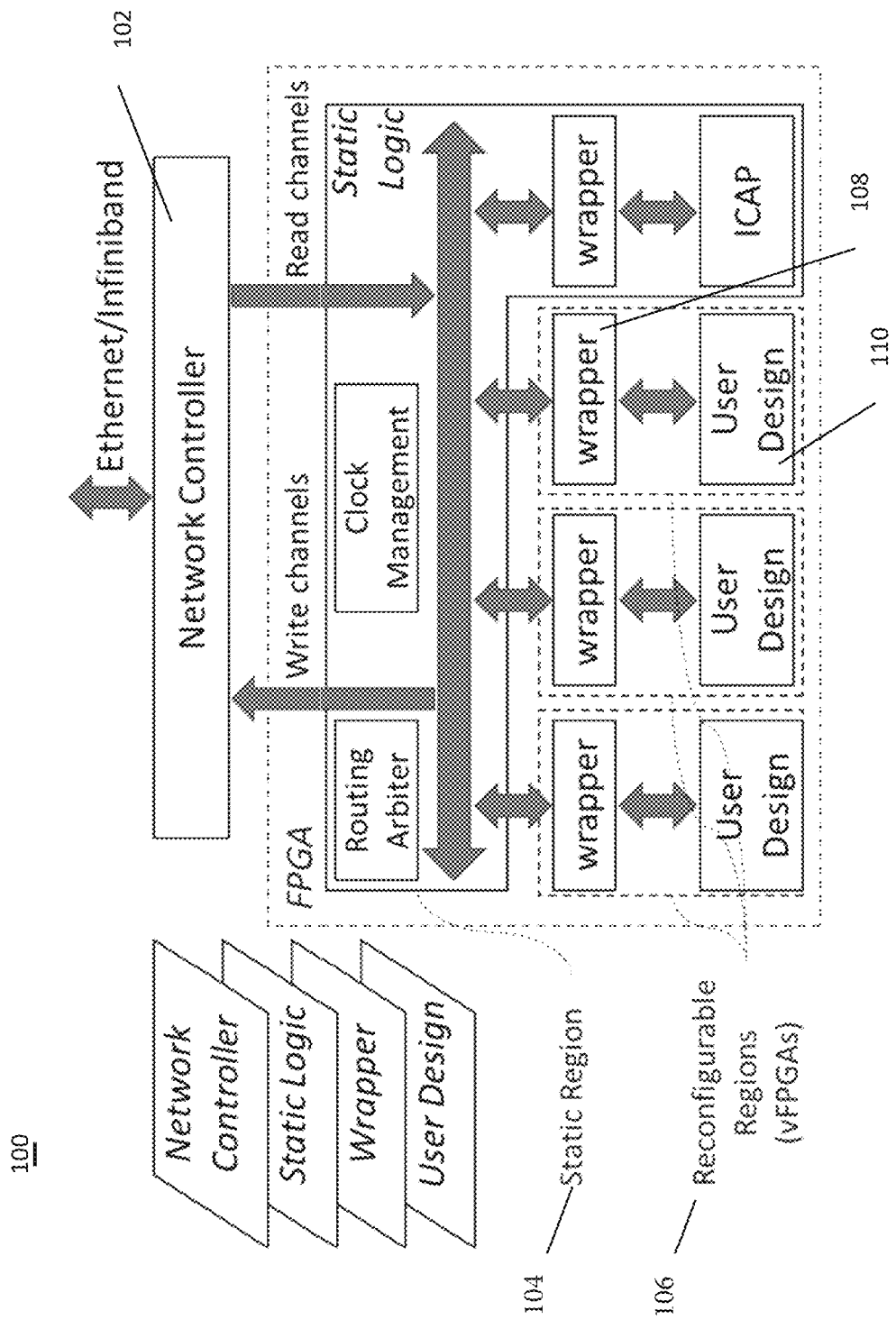
FIG. 1 is a diagram of an example virtualization platform in accordance with some implementations.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Aspects of this disclosure are directed to methods, systems, and computer readable media for FPGA virtualization.

Though FPGAs have achieved significant performance gains for many application domains, implementing applications on FPGAs still remains a non-trivial task. This can be especially true for FPGAs in a data center or a cloud computing environment. Some implementations include a platform for virtualizing FPGAs. Some implementations permit the rapid deployment (or porting) of applications on cloud-based or data-center attached FPGAs. Some implementations of the platform disclosed herein can provide a general abstract interface to any design (not domain specific) and can support dynamic partial reconfiguration (e.g., so designs can be added to an FPGA that has other applications running) at comparable overhead to other notable platforms. Experimental results using a streamed application in a cloud-like environment have shown that the disclosed platform is a viable computing option (in terms of throughput, among other things) for suitable applications compared to conventional server-based or virtual-machine based software implementations.

In one aspect the subject matter disclosed herein provides a methodology and platform for virtualizing FPGAs such that application developers can seamlessly deploy applications, as custom circuits, on a data center-attached FPGA in a similar manner to deploying a software application on a virtual machine. Physical FPGAs are partitioned into several regions, called vFPGAs, having a common infrastructure, or static logic, for communication and re-configuration. The static logic remains constant and does not need re-configuration. A user design deployed on the present FPGA virtualization platform can be configured and accessed remotely over a TCP/IP network. Based on dynamic reconfiguration, a flexible wrapper architecture is disclosed. An abstraction layer, the wrapper generator, bridges the gap between the user's custom interface and the fixed FPGA interface in the disclosed FPGA virtualization platform. Wrappers are automatically generated for any application's circuitry and synthesized to generate a partial bitstream for virtual FPGAs (vFPGAs).

Some implementations can include an FPGA virtualization methodology and platform based on dynamic partial reconfiguration that is suitable for any hardware design (e.g., not domain specific), with a complete interface abstraction layer. The interface abstraction layers can include platform management logic (or static logic) that is fixed and pre-configured on the FPGA. The static logic abstracts the whole platform (with several vFPGAs) as a group of servers, each with a separate MAC/IP (including the reconfiguration management unit within the static logic). This permits the platform to be seamlessly integrated with any Data Center (DC)/cloud management tools (e.g., there may be no need for custom drivers). Also, users can use their vFPGA-based designs in a standard client-server mode without having to write any special drivers.

Some implementations can include a wrapper generator for user designs based on the proposed vFPGA platform. The wrapper generator receives an XML-based description that contains a list of inputs and outputs and their description. The wrapper generator also receives a data description file written using a verification language such as Vera (e.g., format of the incoming/outgoing data to/from the design).

Described below is a detailed test-case prototype implementation and several experimental results to evaluate the overhead of the disclosed FPGA virtualization platform compared with a "bare metal" custom FPGA implementation having direct inputs (e.g., no LAN interface) in terms of area (e.g., FPGA resources), latency, time, power, and throughput. Also described below is a performance comparison showing that the disclosed virtualization platform can outperform a software-based virtualization for a streamed application (e.g., an AES encryption application).

Some implementations of the virtualization platform are based on partial dynamic reconfiguration. The physical FPGA is divided into a static region (e.g., a region that is kept as is with no reconfiguration), several dynamically reconfigurable regions, and a communication controller. Each dynamically reconfigurable region corresponds to one vFPGA where a user design can be placed (along with the wrapper). The wrapper controls clocking the user design according to data arrival. An overview of the disclosed virtualization platform is shown in FIG. 1. The virtualization platform has four distinct layers; a network layer 102, static logic 104, and a reconfigurable region having one or more vFPGAs 106, each having one or more wrapper(s) 108, and user design(s) 110. The network controller 102 handles physical connections and establishes TCP network sessions between the users and their designs in the virtual FPGAs 106. It manages the MACs and IP addresses assigned to the vFPGA. This enables users to use their vFPGA-based applications like any standard server; sending requests (input data) to the assigned IP (in this example implementation ports are ignored, though traffic may be directed to a specific user's sub-circuit based on port number in other implementations). The static logic 104 routes TCP payloads between vFPGAs 106 and the network controller 102. It also contains clock management resources that generate controllable clock domains for each vFPGA and the re-configuration management logic that can download a user's design at run time to one of the vFPGAs. The re-configuration management unit has its own MAC/IP addresses to receive the partial reconfiguration bit streams and reconfigure the vFPGA regions. Having its own MAC/IP address allows it to be integrated with the cloud/DC management tools as a 'Reconfiguration Server'. The wrapper has a fixed interface to the static logic and a custom (automatically-generated) interface to the user's design allowing it to fit into a vFPGA.

Figure 2:
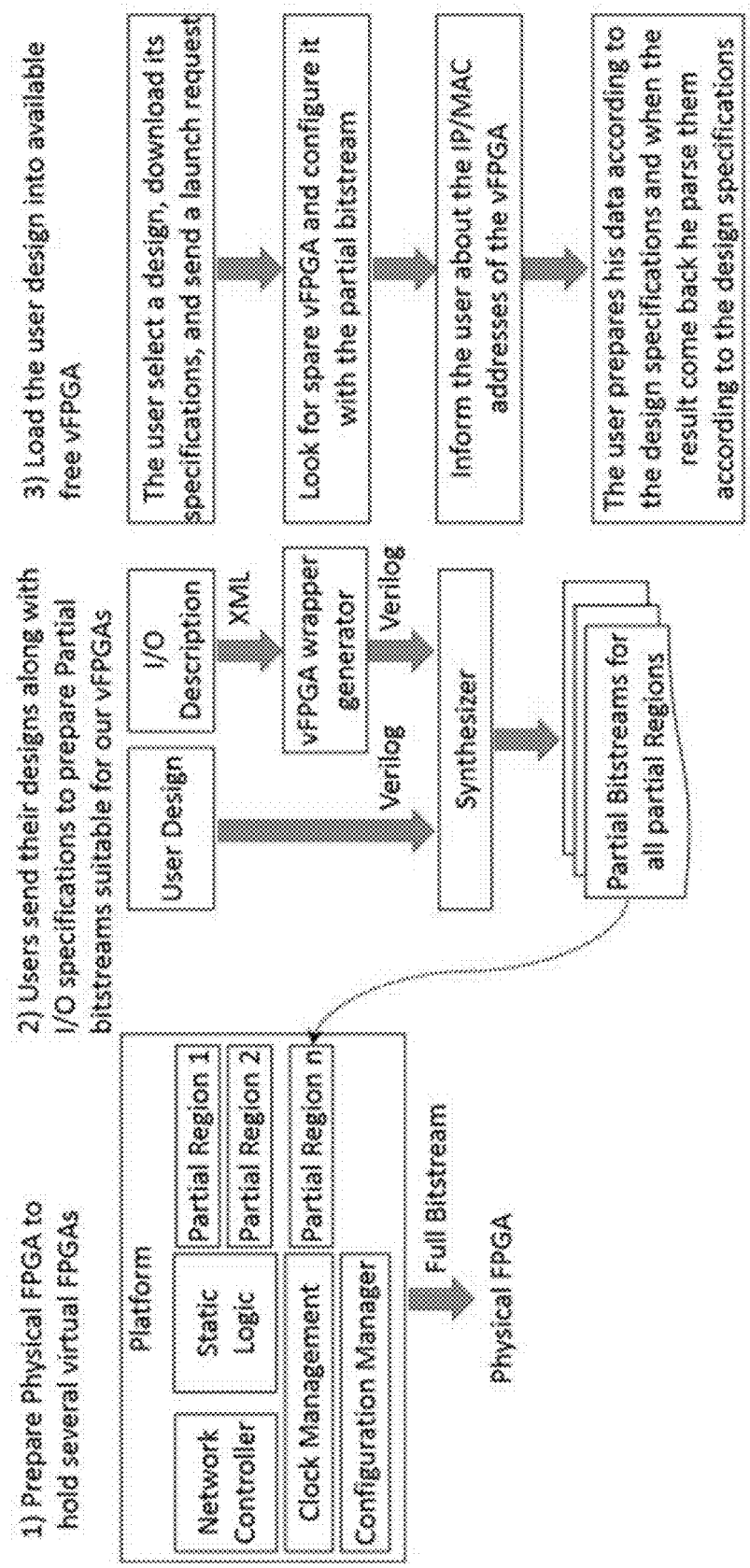
FIG. 2 is a diagram showing steps for creating custom computing machines on datacenter-attached FPGAs using the disclosed FPGA virtualization platform in accordance with some implementations.

FIG. 2 shows the steps of creating datacenter-attached custom computing machines using the disclosed FPGA virtualization platform. FPGAs are pre-configured with the static logic, network controller, clock manager, and configuration manager. A custom wrapper is generated for the user's design based on a user-provided XML specification which is then synthesized with the design to produce the partial configuration bitstream of the design. Several bit streams could be generated for each of the different vFPGA instances available on all the FPGA types attached to the cloud (hence, a user's design can be seamlessly migrated between any vFPGA on the cloud).

Figure 3:
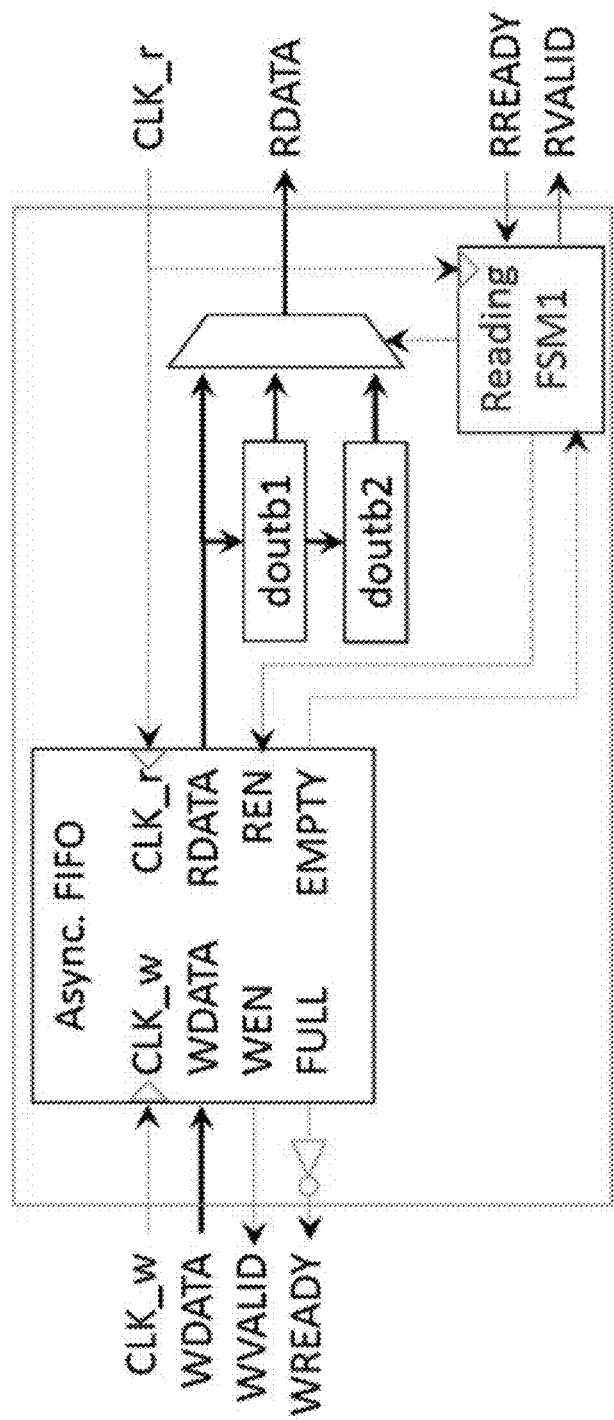
FIG. 3 is a diagram showing an example BRAM-based asynchronous FIFO for transferring data across unrelated clock domains in accordance with some implementations.

Data movement between the four layers of the platform follows the standard two-way handshaking mechanism as defined in AX14 stream specifications. (ARM AMBA AX14-Stream Protocol Specifications, 2010. http://infocenter.arm.com/help/index.jsp?topic=/com.arm.doc.ihi0051a/index.html, which is incorporated herein by reference). This enables both reader and writer to control the data transmission rate and to communicate without losing any cycles. For example, the communication between static and dynamic regions can be done through fixed-width read and write AXI channels. For cross clock-domains data movement between clock regions with unrelated frequencies is achieved with asynchronous FIFOs, FIG. 3. These FIFOs are implemented using embedded FPGA block RAMs (BRAMs). The FIFOs also have AXI read and write interfaces and obey the AXI interfacing protocol. The writing ports of the FIFO are directly mapped to AXI write channel (i.e. write-enable signal corresponds to valid signal and not-full signal corresponds to ready signal). Reading, however, is not straightforward since BRAMs requires two clock cycles for the first read (then one cycle per other consecutive reads). Hence a pre-fetch circuit and control logic can be added to guarantee correct AXI timing (one read per cycle).

In some implementations, the network controller can implement the TCP's data link, network, and session layers of the OSI network stack. It establishes sessions between vFPGAs and their users and ensures data ordering and correctness. It receives users' data, deliver it to the static logic and transmit the results back to the user. More precisely, the network controller performs the following tasks:

1) establishes and terminates TCP sessions between vFPGAs and their users, storing source addresses and other session data;

2) forwards the payload of the received TCP packets to the static logic associated with the target vFPGA index;

3) constructs TCP packets for the received results from vFPGAs and transmits them to their users;

4) stores and manages MAC/IP addresses for all associated vFPGAs and negotiates for dynamic network addressing using the DHCP protocol; and 5) announces the existence of associated vFPGAs over the network and replies to network queries about vFPGAs such as ARP and ping requests.

The network controller can either be integrated with the static logic in the physical FPGA or it can be an off-the-shelf device external to the FPGA. It is also possible to share a network controller among several vFPGAs using a single Ethernet cable connected to the physical FPGA or associate one network controller per vFPGA such that each vFPGA will have a dedicated Ethernet cable connected to the physical FPGA.

The fixed interface between the static logic and the network controller can include, for example, an AXI read-data channel, write-data channel, and the vFPGA indices. In some implementations, the data width can be 8/64 bits for the 1 GE/10 GE Ethernet interface, respectively. Asynchronous FIFOs can be used to move the data across the three clock domains of the static logic, Ethernet transmitter, and Ethernet receiver.

Figure 4:
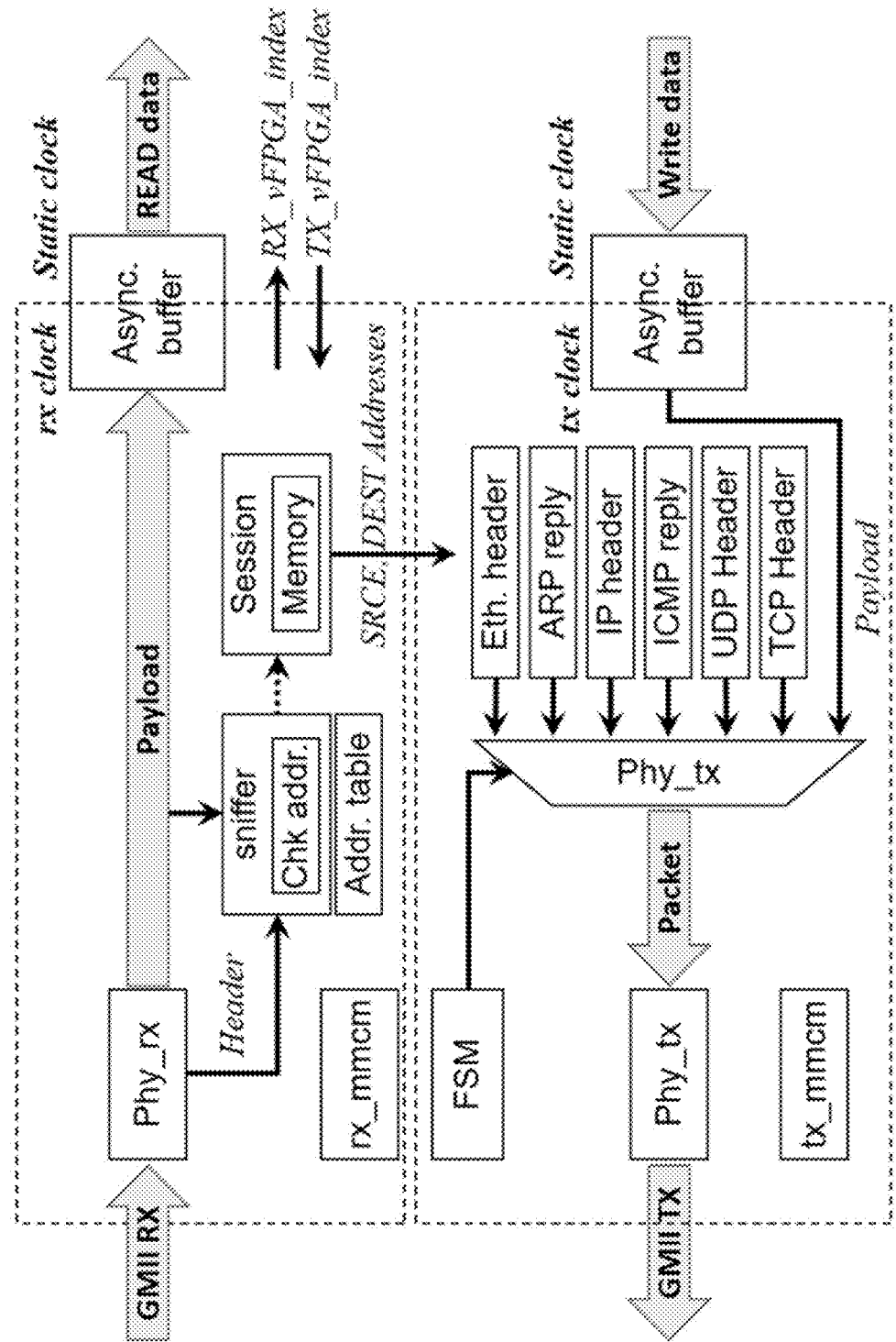
FIG. 4 is a diagram showing an example implementation of an Ethernet controller in accordance with some implementations.

FIG. 4 shows the Ethernet controller designed to achieve the maximum throughput. The receiver works as follows: the Phy_rx receives Ethernet packets and check the packet's CRCs. The sniffer reads packet header on-the-fly, check addresses, and trigger the suitable reaction. If a TCP packet is received, its payload is stored in the rx-Async buffer. The asynchronous buffer depth can hold two packet-payloads. So, a packet can be read while the other packet is buffered. The transmitter works as follows: once the tx-Async buffer has a ready payload, it triggers the finite state machine controller to start constructing an Ethernet packet. Phy_tx transmits the packet and adds a preamble, CFD, and CRC to it.

The static logic includes data routers, a reconfiguration management unit, and a clock management unit. Data routing is needed when the network controller is shared among several virtual FPGAs. Routing data between the network controller and vFPGAs is done through two AXI interconnects. The first one reads from the rx-Async buffer and route to the corresponding vFPGA. The second AXI interconnect reads results from one vFPGAs at a time and forward them to the tx-Async buffer. The result of each vFPGA is collected separately to guarantee no interference with other vFPGAs outputs.

Reconfiguration manager (RM) receives partial bitstreams over the Ethernet to reconfigure any of the vFPGAs. It has its own MAC/IP addresses and the network controller deals with it as another vFPGA. It consists mainly of an internal reconfiguration access port (ICAP) surrounded with a wrapper. It also responsible of freezing the partial region I/O interfaces during the configuration.

Figure 5:
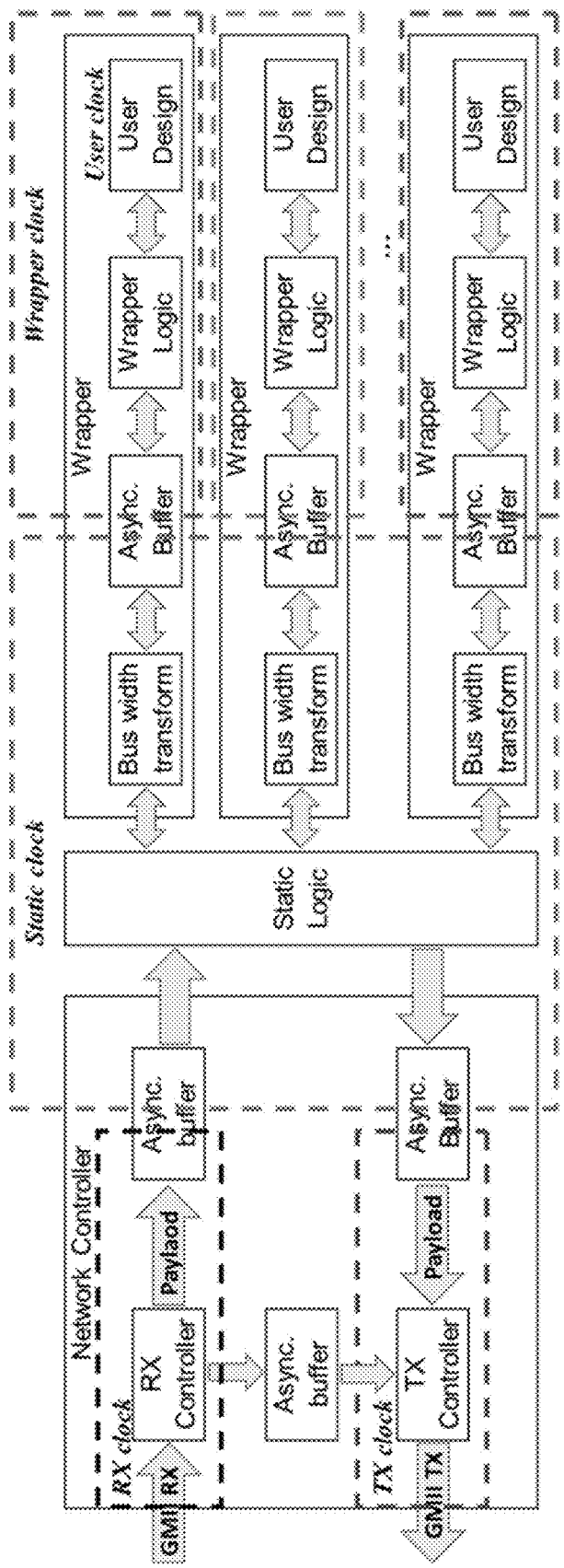
FIG. 5 is a diagram showing use of asynchronous buffers to move data across different clock domains in accordance with some implementations.

The clock management unit produces several clocks for the different domains as shown in FIG. 5. The Ethernet controller has two separate clock domains; one for the transmitter and another for the receiver. The static logic has its own clock domain. Each user design is clocked by a dedicated controllable clock signal. Though the wrapper that surrounds the user design uses the same frequency, it has a separate clock domain than the design. Finally, part of the wrapper shares its clock with the static logic.

Standard clock buffers and clock management units (CMUs) available on commercial FPGAs have many properties that are utilized in the wrapper design. First, they are controllable (e.g., stoppable). The wrapper uses this property to stall and release the user design clock according the availability of input data and other conditions. Second, they are run-time reconfigurable, allowing the wrapper to set the user design's clock frequency at run-time. Third, their clock phases can be shifted by 180 to provide negative edge clocking for the user design.

Figure 6:
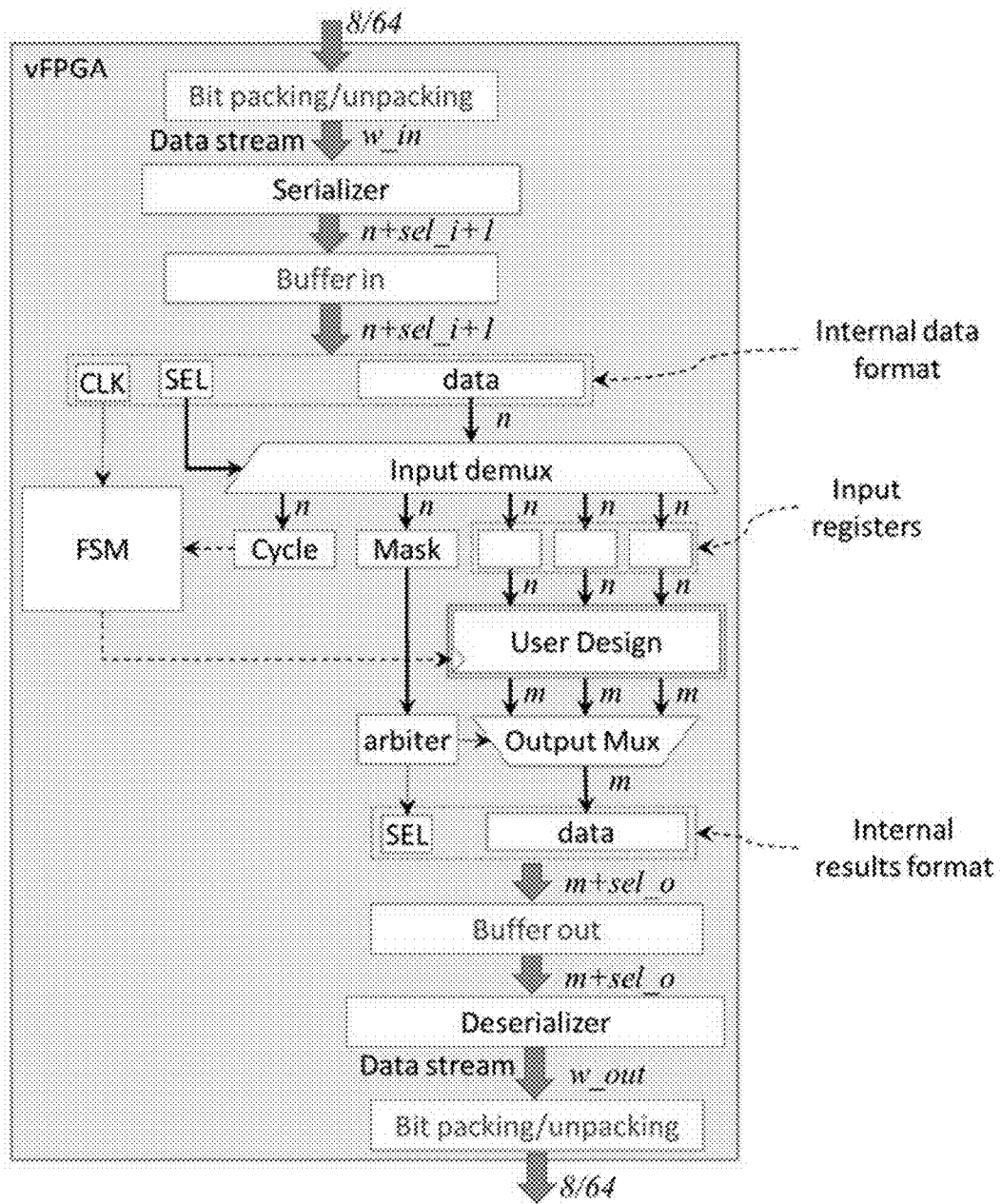
FIG. 6 is a diagram showing an example wrapper design in accordance with some implementations.

The wrapper allows users to fit, communicate, and control their designs in any partially reconfigurable region (vFPGA) through a fixed interface with the fixed logic. FIG. 6 shows the conceptual design of the wrapper with the different stages. Data is received/sent using fixed word sizes (e.g., matching that of the network). Packing/unpacking circuits convert received/sent words to data. A serializer then applies the inputs in user-specified groups in the user specified order.

Figure 7:
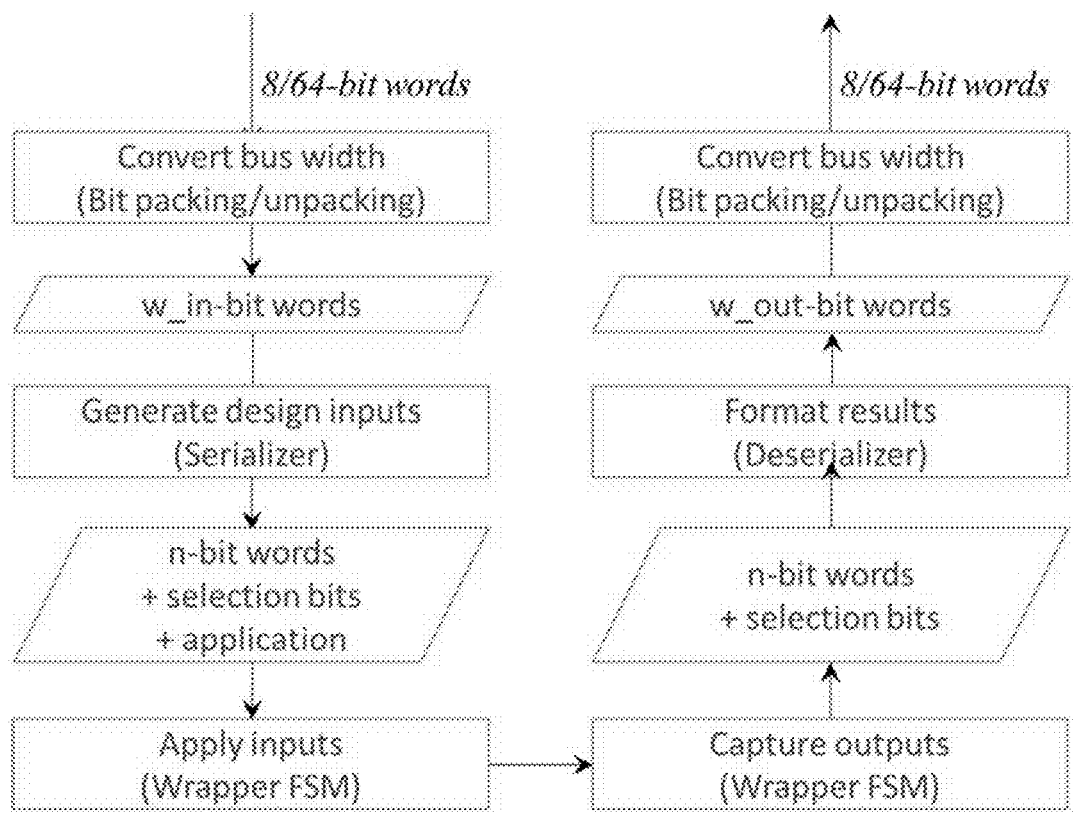
FIG. 7 is a flow chart illustrating data flow from/to the design through the wrapper in accordance with some implementations.

FIG. 7 shows a simple flow chart describing the operation of the wrapper. When a network packet arrives, its payload is extracted and sent to the vFPGA as a sequence of c-bit words (c=8 or 64). The packing/unpacking circuitry receives the sequence of words, accumulates them and reformat them into w_in-bit words. The packing/unpacking circuitry is designed to achieve the maximum throughput. If c>w_in, one output is produced per cycle, and if c<w_in, one output is produced each w_in/c cycles. If c=n, then the packing/unpacking circuits are removed from the wrapper. The serializer receives the data as w_in-bit words and outputs them as n-bit words according to the user-specified input rules where n represents the size of the input group (different input groups might have different sizes).

Figure 8:
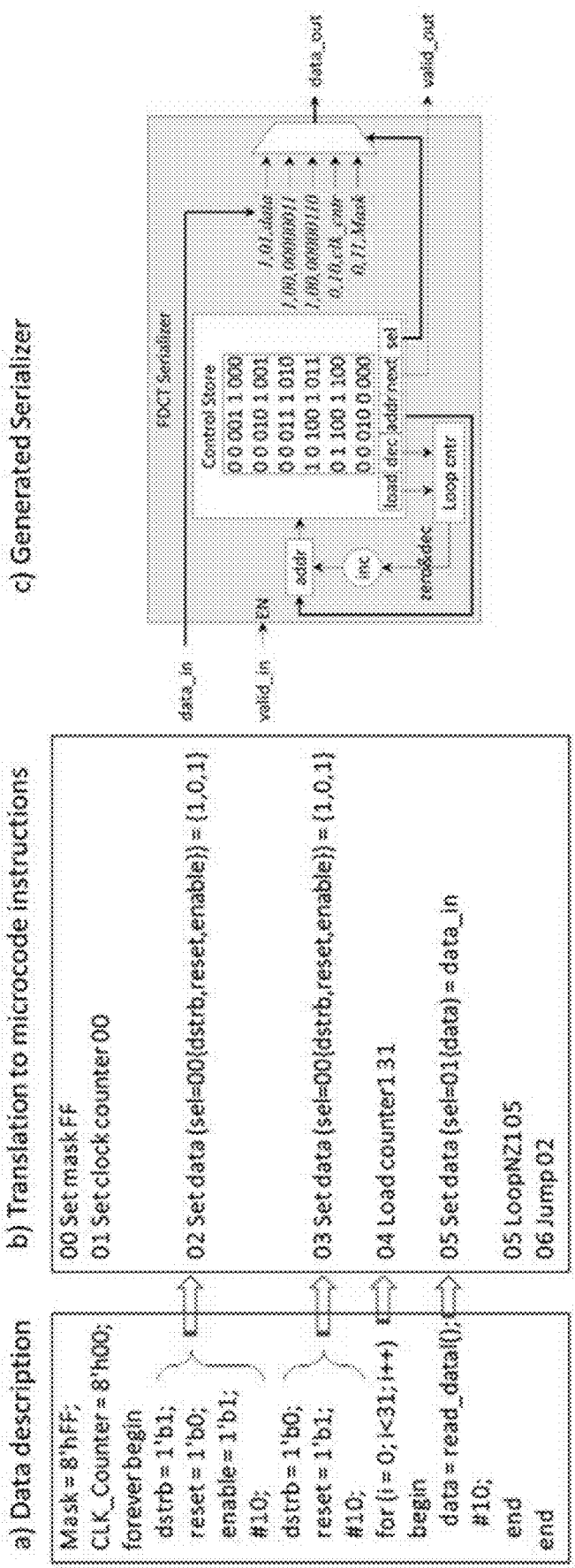
FIG. 8 is a diagram showing generation of a serializer from a data description provided by a design developer in accordance with some implementations.

FIG. 8 illustrates how the serializer is generated from the user data description. With each n-bit word, the serializer adds a clock-control bit (i.e. indicating whether to strobe the design or not) and selection bits to direct the n-bit word to an input data register or a control register (mask or cycles registers).

Outputs of the serializer are stored in an asynchronous FIFO input buffer. Asynchronous FIFOs are used as buffers to allow the movement of data across the different clock domains (the packing/unpacking circuits use the static logic's clock while the rest of components use the wrapper's clock). The inputs to the user's design are registered in one register or groups of registers to allow separate control of different inputs. Hence, inputs that do not change frequently (e.g. reset, enable, and other control signals) can be set in a separate group so their values are sent (or set by the serializer) only one time at the beginning instead of sending their values with each input. The cycles register stores the number of clock cycles that should be applied after each input and is updated at run-time by the serializer. The cycle register is also useful because it gives the user the ability to flush their pipeline while waiting for inputs.

Table 1 shows the details of the wrapper fixed interface which includes the wrapper's clock, the static logic's clock, user-design's clock and clock-enable, wrapper's reset, and AXI read/write channels with fixed data width (8 or 64-bits depending on the Ethernet interface being used). The wrapper is automatically generated for each design according to a user-provided XML input/output specification. The designer also prepares a description of the data format and application/capture rules using a subset of the verification language OpenVera (SystemVerilog). (F. Haque, J. Michelson, and K. Khan. The Art of Verification with VERA (1 ed.), Verification Central, 2001, which is incorporated herein by reference). In the XML description, the designer can divide the design inputs and outputs into groups such that one input/output group is applied/captured at each clock cycle. If there are more than one output group, the design is stalled until all groups are captured. The "Mask register" width is equal to the number of output groups and determines which output group should be transmitted back to the user every cycle. Moreover, the designer can set a property "Mask=True" for any wire in an output group to define it as a "valid out" signal (e.g., to act as a strobe for capturing that output group). The output arbiter receives the mask register value ANDed with the "valid out" signals, if there is any, and produces a selection index that determine which output should be captured. The output arbiter stalls if the output FIFO is full.

An FSM controls clocking the user's design according to data arrivals and user specifications, reading data from the input FIFO, applying it to the inputs, reading the output results, and capturing outputs and storing them in the output FIFO. When a new input arrives, if its clock-control bit is on, the FSM clocks the user design for the number of cycles indicated in the cycles register.

Figure 9:
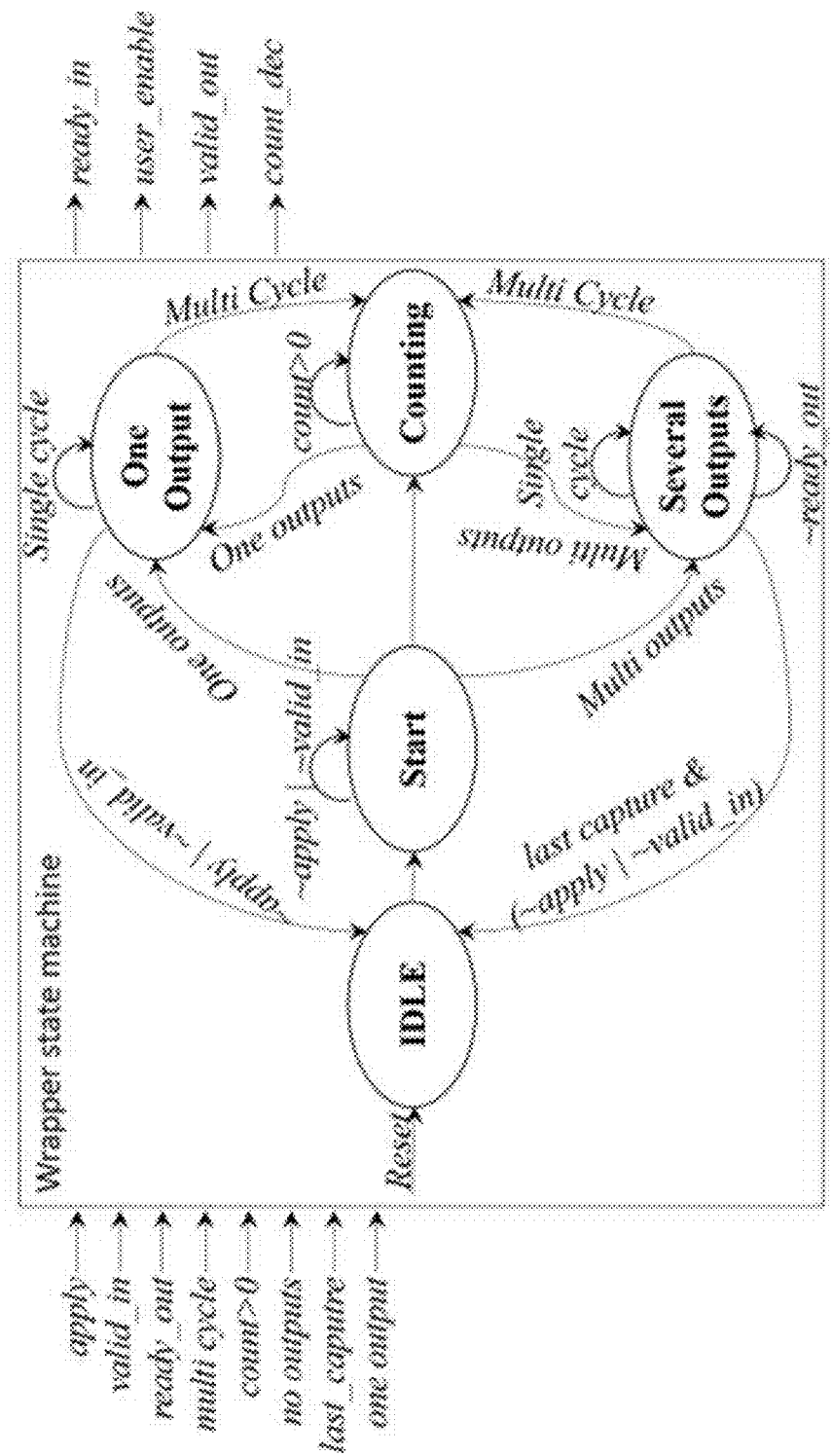
FIG. 9 is a state diagram of an FSM controller of a wrapper in accordance with some implementations.

FIG. 9 shows the state diagram of an example FSM. The wrapper reaches the "counting" state if the user has specified several clock cycles per input application. At this state, the wrapper stalls inputs and stop capturing outputs until the clock count reach zero. The wrapper goes to the "One output" state if there is only one or no output to capture. This state allows receiving inputs while capturing the output. In the "multi-output" state, the wrapper keeps capturing output without accepting new inputs until it receives the "last output" signal from the output arbiter (reading new inputs can overlap with the capturing the last output).

TABLE 1

The fixed interface between the static logic and the user's design in the vFPGA.

| Signal | Direction | Description |
|---|---|---|
| CLK_static_logic | In | Clocking |
| CLK_wrapper | In | |
| CLK_user_design | In | |
| CLK_enable | Out | |
| Ready_in | Out | AXI input |
| Valid_in | In | interface |
| Data_in (8/64 bits) | In | |
| Ready_out | In | AXI output |
| Valid_out | Out | interface |
| Data_out (8/64 bits) | Out | |

To verify the effectiveness of the disclosed FPGA virtualization platform and evaluate its area, power, and speed overhead, a complete test platform was implemented and used to host four different designs placed in its vFPGAs. Four different open IP cores were used as benchmarks (see, E. Villar and J. Villar, "High Performance RSA 512 bit IPCore," 2010; D. Lundgren, "JPEG Encoder Verilog", 2010; S. T. Eid, "DCT—Discrete Cosine Transformer," 2001; and H. Hsing, "AES core specifications," 2013. All from: https://opencores.org/, each of which is incorporated herein by reference); an RSAS12 encryption engine, a JPEG Encoder (JPEGEnc), a fast discrete cosine transformation (FDCT) engine, and an AES encryption (AES128) engine. A Virtex6 Xilinx FPGA with a 1/10 Gigabit Ethernet port (XC6VLX550t) was used to host the virtualization platform with four the vFPGAs. The 4 IP cores were synthesized with the generated wrapper and a partial configuration bit stream was generated for each IP core targeting one of the created vFPGAs. Xilinx's Plan ahead tool was used to make four reconfigurable regions (vFPGAs) on the FPGA beside the static logic and network controller regions. The 4 IP core circuits were then configured on the FPGA via the static logic's configuration controller using the internal configuration access port (ICAP). Using Xilinx's ChipScope, a technology that allows real-time monitoring of internal FPGA signals, the proper operation of the wrappers were verified.

Figures 10A, 10B:
FIG. 10A is a diagram showing generation of a wrapper for a JPEG Encoder from XML and Vera specifications in accordance with some implementations.
FIG. 10B shows the Vera description of the JPEG Encoder's data in which the wrapper generator uses these details to generate the serializer.

As an example, FIG. 10A shows the XML description of the JPEG Encoder's interface used to generate the wrapper. The specially developed tool assumes that the wrapper data bus width (same as the 10 GE Ethernet controller) is 64 bits. Lines 3-to-6 and 7-to-10 in the XML description define two input groups with a maximum input width (n) of 25 bits. Adding two selection bits and one bit for clock control results in 28 bits, the input FIFO width. For outputs, there is only one group (lines 11-16). Therefore, the mask register is only one bit wide, and the tool removes the unneeded output arbiter and multiplexer. Setting the property mask="true", line 15, means that the output will be captured only when "data_ready" is high. Since the total input width is 28 bits which is less than the input data bus, an unpacking circuit is instantiated at the wrapper inputs because while a packing circuit is instantiated at the wrapper's output because (output is 39 bits which is less than the output bus width, 64 bits).

FIG. 10B shows the Vera description of the JPEG Encoder's data. It describes how the data should be applied to the circuit. In this case, it specifies that the circuit receives one block of the image at a time, does computation, produces compressed data for the block, and repeat this process with other blocks until it finishes the image. Each block of data of the image is applied to the inputs using 64 consecutive clock cycles. The "enable" signal should stay high during the input of each block and should be brought low for one cycle between each two consecutive blocks. It also specifies that there is a minimum of 13 cycles of computation between each two consecutive blocks where no new data can be applied to the inputs. The wrapper generator uses these details to generate the serializer.

Figure 10C:
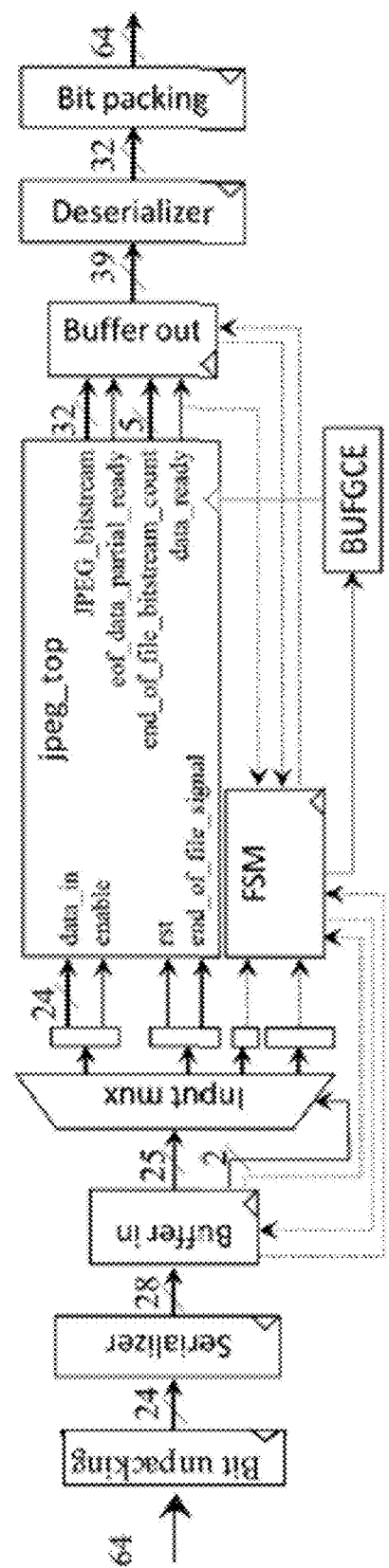
FIG. 10C is a diagram showing an embodiment in which the generated serializer receives 24-bit RGB color for one pixel at a time.
Figure 11:
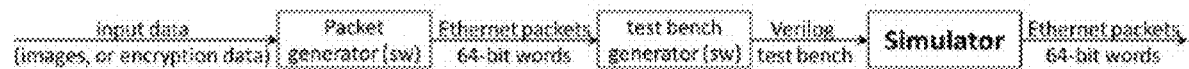
FIG. 11 is a diagram of an example simulation methodology in accordance with some implementations.

As shown in FIG. 10C, the generated serializer receives 24-bit RGB color for one pixel at a time. The serializer has 28-bits output which are; clock (1 bit), selection (2-bits), enable (1-bit), and data. The selection has two bits because the XML description defines only two input groups. The wrapper generator produces a Verilog file with the user design instantiated as a component. After generating a wrapper, a partial bitstream is generated for it and stored to be launched upon a user request.

To evaluate the overhead of the disclosed FPGA virtualization technique, the technique was compared to a direct implementation of the four IP cores on the same FPGA (e.g., bare-metal with no virtualization) without any design modifications to the IP cores. Also, to eliminate the effect of frequency on performance, all IP cores for both implementations were operated at 156.25 MHz, the 10 GE Ethernet controller frequency. Though the direct implementation with inputs/outputs applied/captured directly to/from the IP cores through the FPGA I/O pins may not be practical or even realizable, it constitutes the theoretical best-case in terms of area, power, and speed, which is why this approach was used as a baseline for evaluating the area/power/speed overhead of the disclosed FPGA virtualization platform.

Table 2 summarizes the virtualization overhead of the disclosed FPGA virtualization platform compared to the direct implementation in terms of area, latency, power, and throughput. For these results, in order to obtain the overhead for each IP core separately, four copies of each IP core were placed on the virtualization platform since the static logic is actually shared between the four vFPGAs. The results in Table 2 are based on post place and route simulations. This is due to two reasons; 1) there is not a practical way to inject/readout inputs/outputs to the direct FPGA implementations, and 2) a 10 GE switch was not available to send packets to the vFPGA platform. The total computation times are measured from sending the first Ethernet packet of the user's input data until receiving the last Ethernet packet of the results. In the case of the AES128, the computation time overhead is dominated by the communication overhead. The total computation time overhead for the other 3 IP cores is acceptable because computations are more prominent than communication for these benchmarks.

Latency was measured as the time from receiving the first input until producing the first output. For the vFPGA, the latency increase is attributed to the initialization of the mask register and the clocking counter which consumes 150-200 nano-seconds. AES128 latency increased more than others because its input size is 128 bits which is double the data bus width of the system which in turns made the wrapper halves the IPs clock frequency. For such IP cores (with extra-wide input/output widths), a larger bus width would reduce the latency overhead.

TABLE 2

Virtualization overhead compared to direct implementation on an FPGA for 4 benchmarks. For the vFPGAs, the wrapper's I/O widths are 64/64 bits for all designs.

| Benchmark | RSA512 | DCT | JPEG Encoder | AES128 |
|---|---|---|---|---|
| Inputs/Outputs Widths (bits) | 64/16 | 14/13 | 28/39 | 128/128 |
| Total Computation Time (ns) @156.25 MHz | | | | |
| FPGA | 18,750,265 | 175,811 | 73,164 | 131,176 |
| vFPGA | 18,764,874 | 198,860 | 80,377 | 356,403 |
| Overhead | 0.08% | 13.1% | 9.9% | 171.7% |
| Latency (ns) | | | | |
| FPGA | 1,249,974 | 439 | 790 | 131 |
| vFPGA | 1,250,151 | 577 | 941 | 416 |
| Overhead | 0.01% | 31.4% | 19.1% | 217.6% |
| Average Throughput (MB/s) @156.25 MHz | | | | |
| FPGA | 0.20 | 139.6 | 360.4 | 2,381.0 |
| vFPGA | 0.20 | 123.4 | 328.0 | 876.6 |
| Overhead | −0.08% | −11.6% | −9.0% | −63.2% |
| Dynamic power (mW) | | | | |
| FPGA | 138.9 | 248.6 | 433.3 | 717.7 |
| vFPGA | 362.8 | 347.0 | 822.2 | 1,239.8 |
| Overhead | 161.2% | 39.6% | 89.8% | 72.7% |
| Area (Slices) | | | | |
| FPGA | 2,676 | 726 | 9,693 | 919 |
| vFPGA | 3,083 | 1,263 | 14,470 | 1,820 |
| Overhead | 15.2% | 74.0% | 49.3% | 98.0% |

Average throughput was measured as the ratio of the total data over the total time for both virtual and physical FPGAs in the table. Throughput overhead of the vFPGA platform was around 10% except for the AES128 circuit. The overhead depends on how much unpacking/unpacking are required and how much of the control bits are consumed with the data per cycle. For the RSA 512 benchmark, the IP core's input width matches the wrapper's very well, hence unpacking takes very little overhead. For the DCT and JPEG Encoder, unpacking becomes more significant (the DCT is slightly better matched with the wrapper's data width). As mentioned before, due to the huge mismatch between the AES128 input width and the wrapper's, the effective frequency of this IP core's clock was half that of the wrapper (and the physical FPGA version), yielding the largest throughput overhead. Again, a wider data bus would have reduced this overhead significantly.

Area overhead is measured in FPGA slices and is due to the wrapper and static logic. The static logic's total area is constant at 2,377 slices (~3%), or ~600 slices per vFPGA. The wrapper's area dominates the area overhead and varies for each benchmark depending on its input and output size because of the packing/unpacking circuitry.

Figure 12:
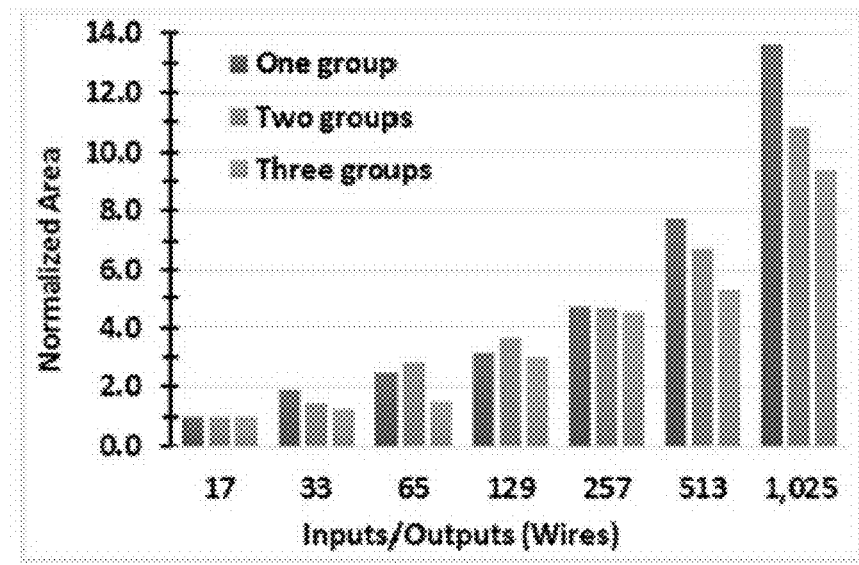
FIG. 12 is a chart comparing wrapper area versus the number of IP I/Os for 1, 2, and 3 grouping in accordance with some implementations.

FIG. 12 illustrates how the wrapper area (LUTS and FFs) changes as a function of the inputs/outputs data widths. For this figure, the design is treated as a black box with the equal number of inputs and outputs, and for each I/O width, three wrappers were generated; assuming the inputs/outputs are grouped into one, two, or three groups. The wrapper's area increases exponentially with the I/O width while dividing the I/O into groups reduces the area significantly.

Power overhead is incurred due to the additional circuitry of the wrapper and static logic. The effect of the wrapper and static logic on power is more prominent for IPs that have less time overhead (e.g. the RSA512) since the total energy per computation (independent of the frequency) is spent over less time which increases the average power. The results reported in Table 2 are based on active power (i.e. during operation of vFPGA-based designs). Also, the overhead depends on the size of vFPGA circuits relative to the wrapper's and static logic. In this case, the IP cores are relatively small, increasing the relative overhead.

Table 3 below shows a comparison of the disclosed FPGA virtualization platform with other notable platforms for attaching FPGAs to DCs. The table summarize the type of the platform and its interface (to the user's design), area overhead in terms of FPGA resources (for the overlay, it is reported as ratio to the bare-metal design), the platform components (i.e. static logic), and whether partial reconfiguration is supported or not. The VirtualRC overlay architecture was included because it provides an abstracted application-specific interface that can be used to attach an FPGA-design to a DC. (see, R. Kirchgessner, G. Stitt, A. George, and H. Lam, "VirtualRC: A Virtual FPGA Platform for Applications and Tools Portability," Proc. ACM/SIGDA International Symposium on Field Programmable Gate Arrays (FPGA'12). pp. 205-208, 2012, which is incorporated herein by reference). As this table shows, the disclosed FPGA virtualization platform provides a complete interface abstraction and partial reconfiguration support at a comparable or less area overhead than other techniques.

Figure 13:
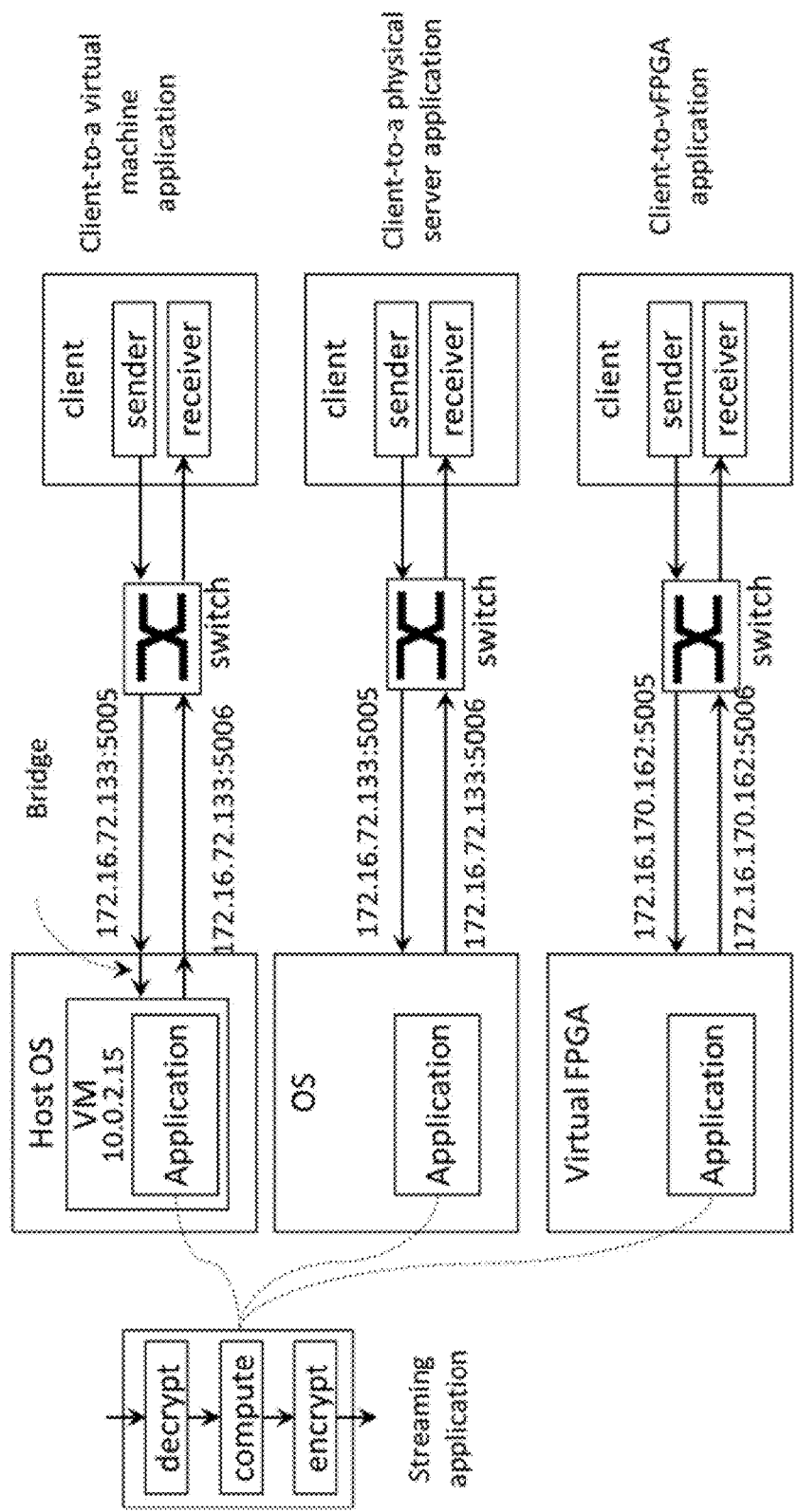
FIG. 13 is a diagram showing platforms used to evaluate the performance of a streaming application in accordance with some implementations.

Cloud-based applications usually run on virtual machines or within containers which introduce remarkable overhead compared to running the same application on the physical machine. To show the viability of FPGA-based computing in clouds with the disclosed vFPGA platform, the performance of an actual streamed application (not simulated) is evaluated when it is run on a virtual machine, a physical machine, and on a vFPGA, all in an environment similar to that of a cloud computing system. For this experiment, we designed a custom streamed application that we believe is a good representation of applications that are suited for both, cloud environment and FPGA implementation. The application involves three main sequential tasks performed on streamed blocks of data: decrypt-compute-encrypt, e.g., receive encrypted data, decrypt it, performs some relatively simple computation on the plain text, then encrypt the results and send the results back to the user. Symmetric key encryption (AES) was used for the encryption and decryption tasks. For the three application platforms, a client application (running on a typical workstation) streams the data over a 1 GE LAN to the three different platforms and receives the streamed results back as illustrated in FIG. 13.

In the client-to-physical server scenario, the application was run (as a server) on a Xeon machine with 8 cores running at 3.00 GHz, 16 GB of RAM, and 64 bit-linux Ubuntu 16.04LTS. In the client-to-virtual machine scenario, Virtualbox was used to build a virtual machine with 4 GB RAM and 64 bit-linux Ubuntu 16.04LTS on another Xeon® machine with same specifications as the first one. The application was written with Python using the Python stream socket programming (STREAM socket programming on python, https://docs.python.org/2/howto/sockets.html, which is incorporated herein by reference) and the Python Cryptography Toolkit (PyCrypto®) (D. C. Litzenberger, "Pycrypto—the python cryptography toolkit," URL: https://www.dlitz.net/software/pycrypto (2016), which is incorporated herein by reference). The measured stream socket throughput between two machines using the code was 113 Mbytes/sec which represents 90% of the IGE link theoretical speed.

TABLE 3

Comparison with notable platforms for attaching FPGAs to DCs.

| Platform | Type | Area overhead | Static logic Components | PR[+] Support |
|---|---|---|---|---|
| MS Catapult | PCI attached, Torous network among FPGAs, PCIe DMA Specific Interface | ≈39,560 ALMs[‡] | two DRAM controllers, four SLite II (to connect over Ethernet), router, PCIe core, reconfiguration management | no |
| Disaggregated FPGAs | Network attached, Specific Interface (similar to OS sockets) | ≈58,128 LUTs +116,256 FFs | DRAM controller, mem virt. module for each vFPGA network controller, management | yes |
| RIFFA2.1 | PCIe DMA Interface | 15,862 LUTs + 14,875 FFs (Xilinx) 15,182 ALUTs + 13,418 FFs (Altera) (without PCI logic) | PCIe core, tx-rx engines for 4 vFPGAs | no |
| DyRACT | PCIe DMA Interface | 16,157 LUTs + 19,453 FFs | PCIe core, tx-rx engines, reconfiguration man., clock man., DMAs | yes |
| Byma | Network Attached, DPR*, Specific Interface | 28,711 LUTs + 29,327 FFs | Soft processor (Reconfiguration management), DRAM controller, | yes |

TABLE 3-continued

Comparison with notable platforms for attaching FPGAs to DCs.

| Platform | Type | Area overhead | Static logic Components | PR[+] Support |
|---|---|---|---|---|
| | for Packet Processing Applications | | MAC Regs., Mem mapping Regs. | |
| VirtualRC | Domain Specific Overlay with Specific Interface | 2,300 LUTs + 4,550 FFs | N/A | no |
| Disclosed FPGA Virtualization Platform | DPR, General | 17,504 LUTs + 20,514 FFs | Network controller (complete TCP stack), clock management, reconfiguration management | yes |

[+]Partial Reconfiguration
[‡]ALM = Adaptive Logic Module (Altera), equivalent to Xilinx's Slice (6-input LUT + 4FFs).
[*]DPR = Dynamic Partial RE-Configuration (for vFPGAs).

The hardware version of the application was built using Hsing's AES core (H. Hsing, "AES core specifications," 2013, from: https://opencores.org/, which is incorporated herein by reference). Since Hsing's core only provides AES-ECB mode encryption, it was modified to implement AES-CTR (for encryption and decryption) which provides stronger security. Two separate instances of the AES-CTR core are used to decrypt and encrypt the streamed data. The three platforms utilized TCP streams to/from the client over the 1 GE LAN switch with a measured sustainable throughput of ~113 MBytes/s.

Figure 14:
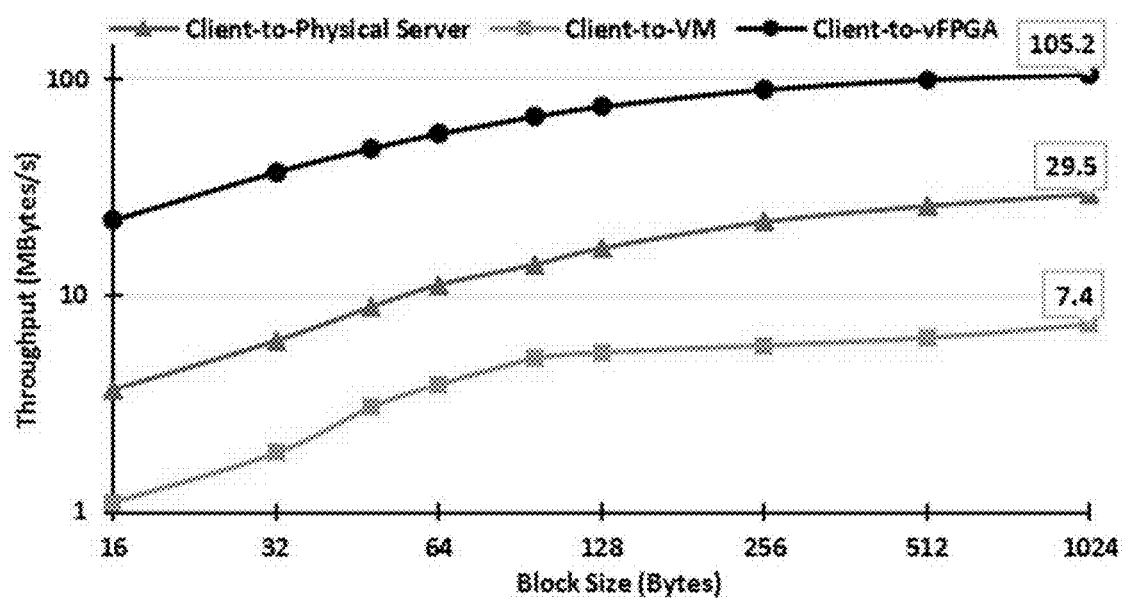
FIG. 14 is a chart showing streaming application throughput versus block size comparisons between the proposed vFPGA platform and physical servers and virtual machines in accordance with some implementations.

The application's performance was evaluated using the measured throughput as a function of the streamed block size for the three implementations as shown in FIG. 14. The total data size was 32 Mbytes and the block size was varied from 16-bytes to 1 KB.

FIG. 14 shows that the throughput of all platforms is affected by the data block size but starts to saturate beyond a block size of 128 Bytes. In the client-to-physical server scenario the maximum attained throughput was 29.5 MB/s while the virtual machine's version maxed out at 7.4 Mbytes/s. However, the vFPGA version reached 105 MBytes/s, approaching the communication link's maximum throughput (~113 MBytes/s). In fact, the vFPGA version throughput was limited by the communication link's throughput not the computation speed. Had 10 GE 10 was used, the AES128 throughput would be 876.6 MBytes/s as was shown in Table 2.

The disclosed FPGA virtualization platform for attaching FPGAs to DCs and clouds can include dynamic partial reconfiguration. A physical FPGA is partitioned into static logic and partially reconfigurable regions representing vFPGAs. An abstract interface between static logic and the vFPGAs has been developed in a form of an automatically generated wrapper. This allows users to place any circuit IP in the vFPGA, send, and receive data from their IP through standard Ethernet communication. An evaluation implementation of the disclosed FPGA virtualization platform was built and estimated virtualization overhead (e.g., compared to direct implementation on FPGAs) was evaluated in terms of performance, area, throughput, latency, and dynamic power. Experiments showed that the disclosed virtualization platform is both feasible and practical. Also, comparison with other platforms for attaching FPGAs to DCs showed that the area overhead of the disclosed FPGA virtualization platform is within the same range of others but with the added advantages of having an abstract interface, support for partial reconfiguration, and not being domain specific. Comparison with software based cloud implementations showed that the disclosed FPGA virtualization platform is a very viable computing option in the cloud for suitable applications. Some implementations can provide support for external RAM (e.g., DDR3). Hence IP cores that require a large amount of RAM can be accommodated with an implementation that provides support for external RAM.

Figure 15:
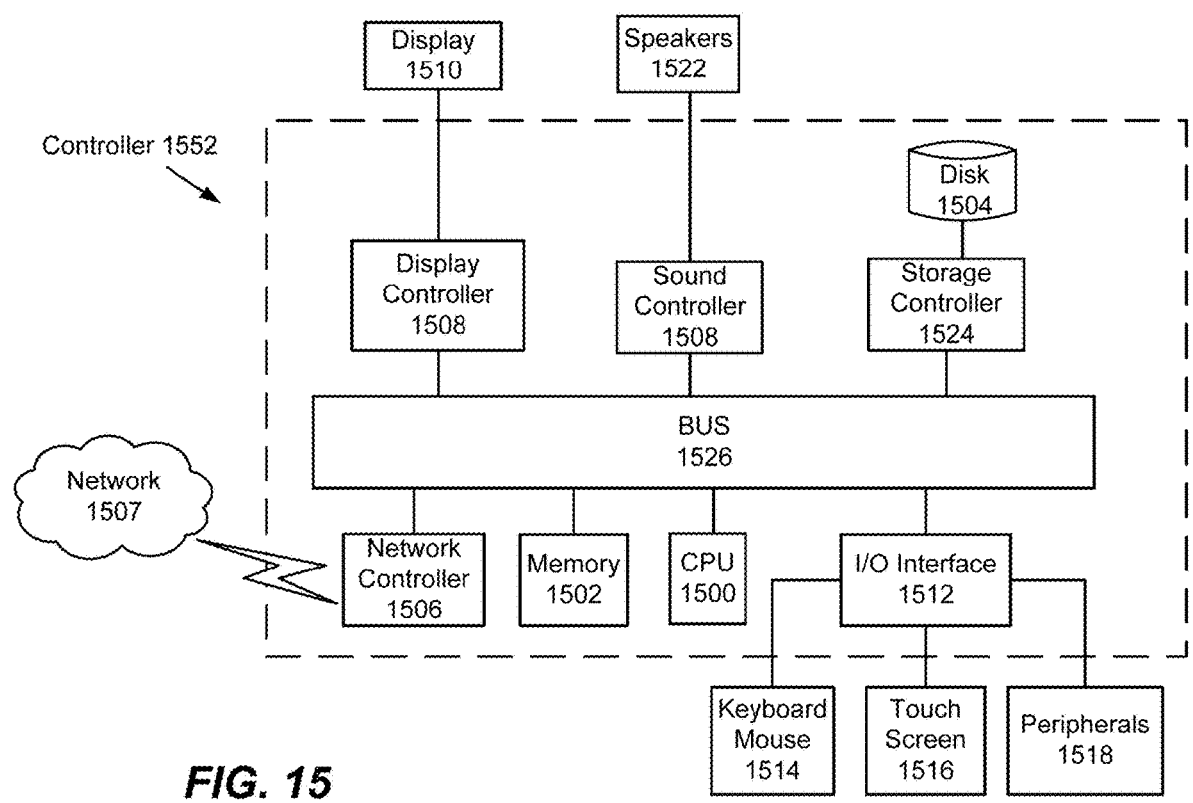
FIG. 15 is a diagram of an example computing device in accordance with some implementations.

Next, a hardware description of a computing device that can host a virtualization platform or is operable to provide reconfiguration information to a virtualization platform according to exemplary embodiments is described with reference to FIG. 15. In FIG. 15, the computing device described is representative of a host computing device or client computing device which includes a CPU 1500 which performs the processes described above/below. The process data and instructions may be stored in memory 1502. These processes and instructions may also be stored on a storage medium disk 1504 such as a hard drive (HDD) or portable storage medium or may be stored remotely.

Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claimed advancements may be provided as a utility application, background daemon, or component of an operating system, or combination thereof, executing in conjunction with CPU 1500 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 1500 may be a Xenon or Core processor from Intel of America or an Opteron processor from AMD of America, or may be other processor types that would be recognized by one of ordinary skill in the art. Alternatively, the CPU 1500 may be implemented on an FPGA, ASIC, PLD or using discrete logic circuits, as one of ordinary skill in the art would recognize. Further, CPU 1500 may be implemented as multiple processors cooperatively working in parallel to perform the instructions of the inventive processes described above.

The computing device in FIG. 15 also includes a network controller 1506, such as an Intel Ethernet PRO network interface card from Intel Corporation of America, for interfacing with network 1507. As can be appreciated, the network 1507 can be a public network, such as the Internet, or a private network such as an LAN or WAN network, or any combination thereof and can also include PSTN or ISDN sub-networks. The network 1507 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1508, such as a NVIDIA GeForce GT7 or Quadro graphics adaptor from NVIDIA Corporation of America for interfacing with display 1510, such as a Hewlett Packard HPL2445w LCD monitor. A general purpose I/O interface 1512 interfaces with a keyboard and/or mouse 1514 as well as a touch screen panel 1516 on or separate from display 1510. General purpose I/O interface also connects to a variety of peripherals 1518 including printers and scanners, such as an OfficeJet or DeskJet from Hewlett Packard.

A sound controller 1520 is also provided in the computing device such as Sound Blaster 7-Fi Titanium from Creative, to interface with speakers/microphone 1522 thereby providing sounds and/or music.

The general purpose storage controller 1524 connects the storage medium disk 1504 with communication bus 1526, which may be an ISA, EISA, VESA, PCI, or similar, for interconnecting all of the components of the computing device. A description of the general features and functionality of the display 1510, keyboard and/or mouse 1514, as well as the display controller 1508, storage controller 1524, network controller 1506, sound controller 1520, and general purpose I/O interface 1512 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 16.

Figure 16:
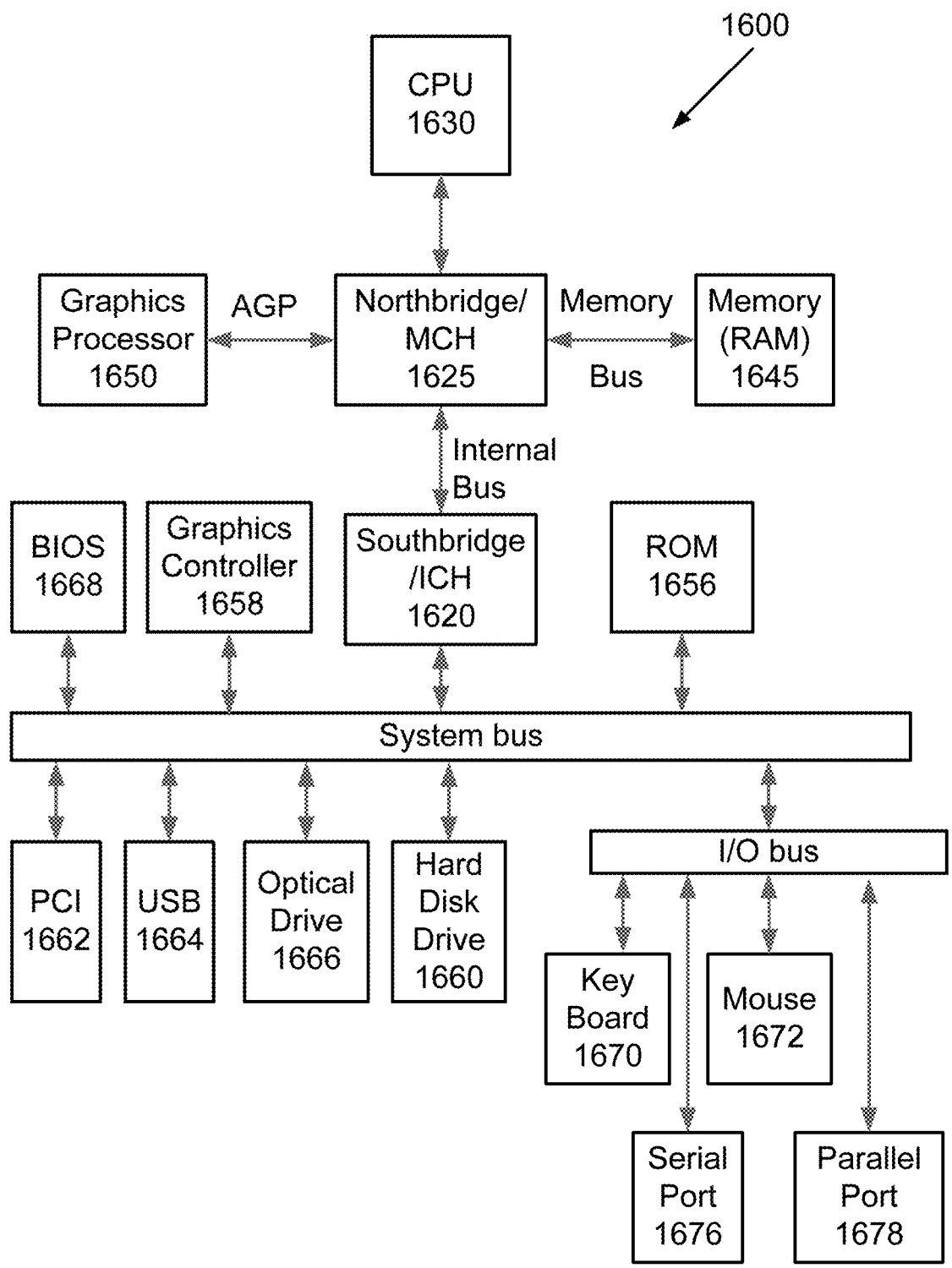
FIG. 16 is a schematic diagram of a data processing system in accordance with some implementations.

FIG. 16 shows a schematic diagram of a data processing system, according to certain embodiments, for performing the functions of the exemplary embodiments. The data processing system is an example of a computer in which code or instructions implementing the processes of the illustrative embodiments may be located.

In FIG. 16, data processing system 1600 employs a hub architecture including a north bridge and memory controller hub (NB/MCH) 1625 and a south bridge and input/output (I/O) controller hub (SB/ICH) 1620. The central processing unit (CPU) 1630 is connected to NB/MCH 1625. The NB/MCH 1625 also connects to the memory 1645 via a memory bus, and connects to the graphics processor 1650 via an accelerated graphics port (AGP). The NB/MCH 1625 also connects to the SB/ICH 1620 via an internal bus (e.g., a unified media interface or a direct media interface). The CPU Processing unit 1630 may contain one or more processors and even may be implemented using one or more heterogeneous processor systems.

Figure 17:
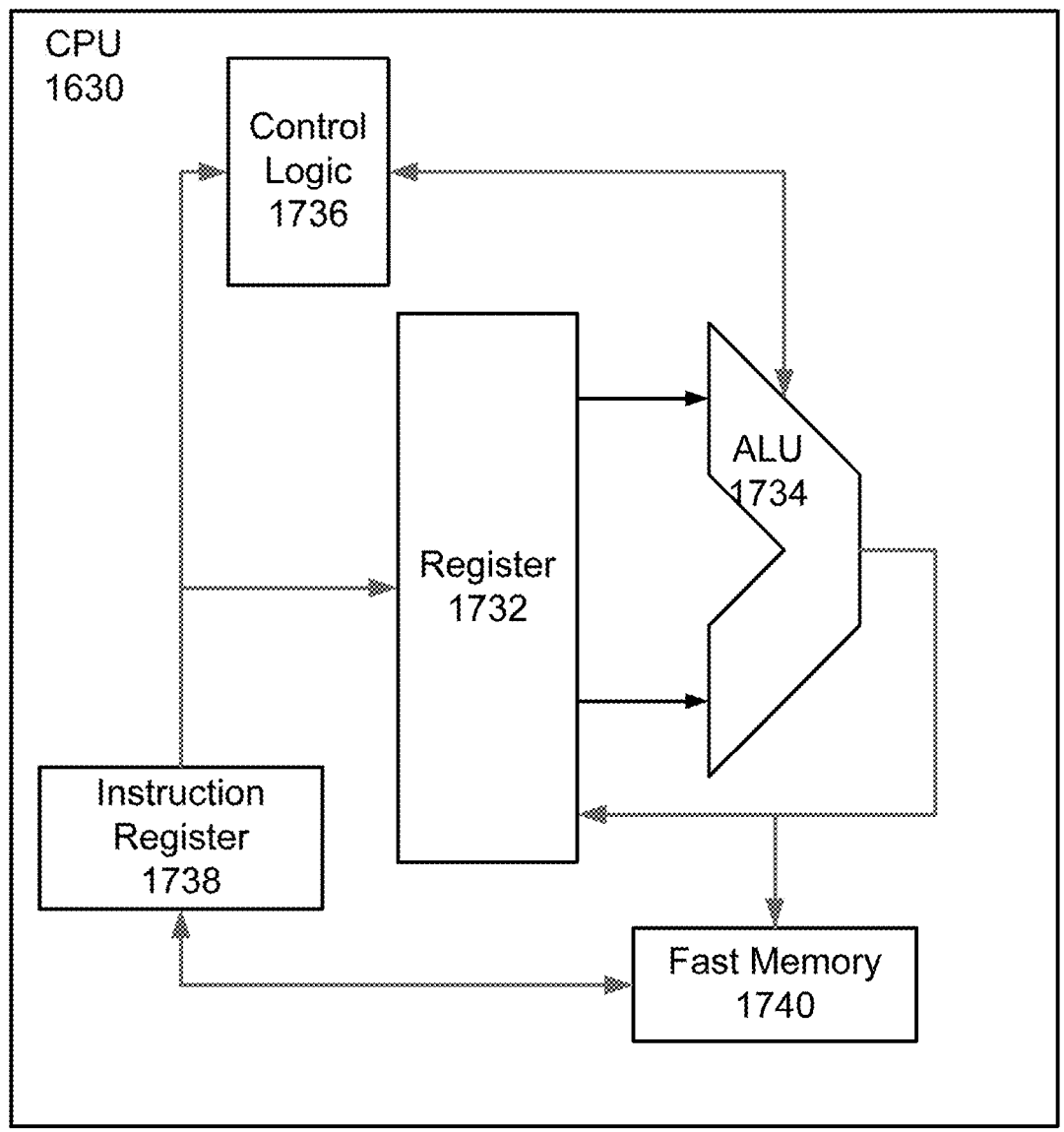
FIG. 17 is a diagram of an example CPU implementation in accordance with some implementations.

For example, FIG. 17 shows one implementation of CPU 1630. In one implementation, the instruction register 1738 retrieves instructions from the fast memory 1740. At least part of these instructions are fetched from the instruction register 1738 by the control logic 1736 and interpreted according to the instruction set architecture of the CPU 1630. Part of the instructions can also be directed to the register 1732. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1734 that loads values from the register 1732 and performs logical and mathematical operations on the loaded values according to the instructions. The results from these operations can be feedback into the register and/or stored in the fast memory 1740. According to certain implementations, the instruction set architecture of the CPU 1630 can use a reduced instruction set architecture, a complex instruction set architecture, a vector processor architecture, a very large instruction word architecture. Furthermore, the CPU 1630 can be based on the Von Neuman model or the Harvard model. The CPU 1630 can be a digital signal processor, an FPGA, an ASIC, a PLA, a PLD, or a CPLD. Further, the CPU 1630 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 16, the data processing system 1600 can include that the SB/ICH 1620 is coupled through a system bus to an I/O Bus, a read only memory (ROM) 1656, universal serial bus (USB) port 1664, a flash binary input/output system (BIOS) 1668, and a graphics controller 1658. PCI/PCIe devices can also be coupled to SB/ICH 1688 through a PCI bus 1662.

The PCI devices may include, for example, Ethernet adapters, add-in cards, and PC cards for notebook computers. The Hard disk drive 1660 and CD-ROM 1666 can use, for example, an integrated drive electronics (IDE) or serial advanced technology attachment (SATA) interface. In one implementation the I/O bus can include a super I/O (SIO) device.

Further, the hard disk drive (HDD) 1660 and optical drive 1666 can also be coupled to the SB/ICH 1620 through a system bus. In one implementation, a keyboard 1670, a mouse 1672, a parallel port 1678, and a serial port 1676 can be connected to the system bus through the I/O bus. Other peripherals and devices that can be connected to the SB/ICH 1620 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 18:
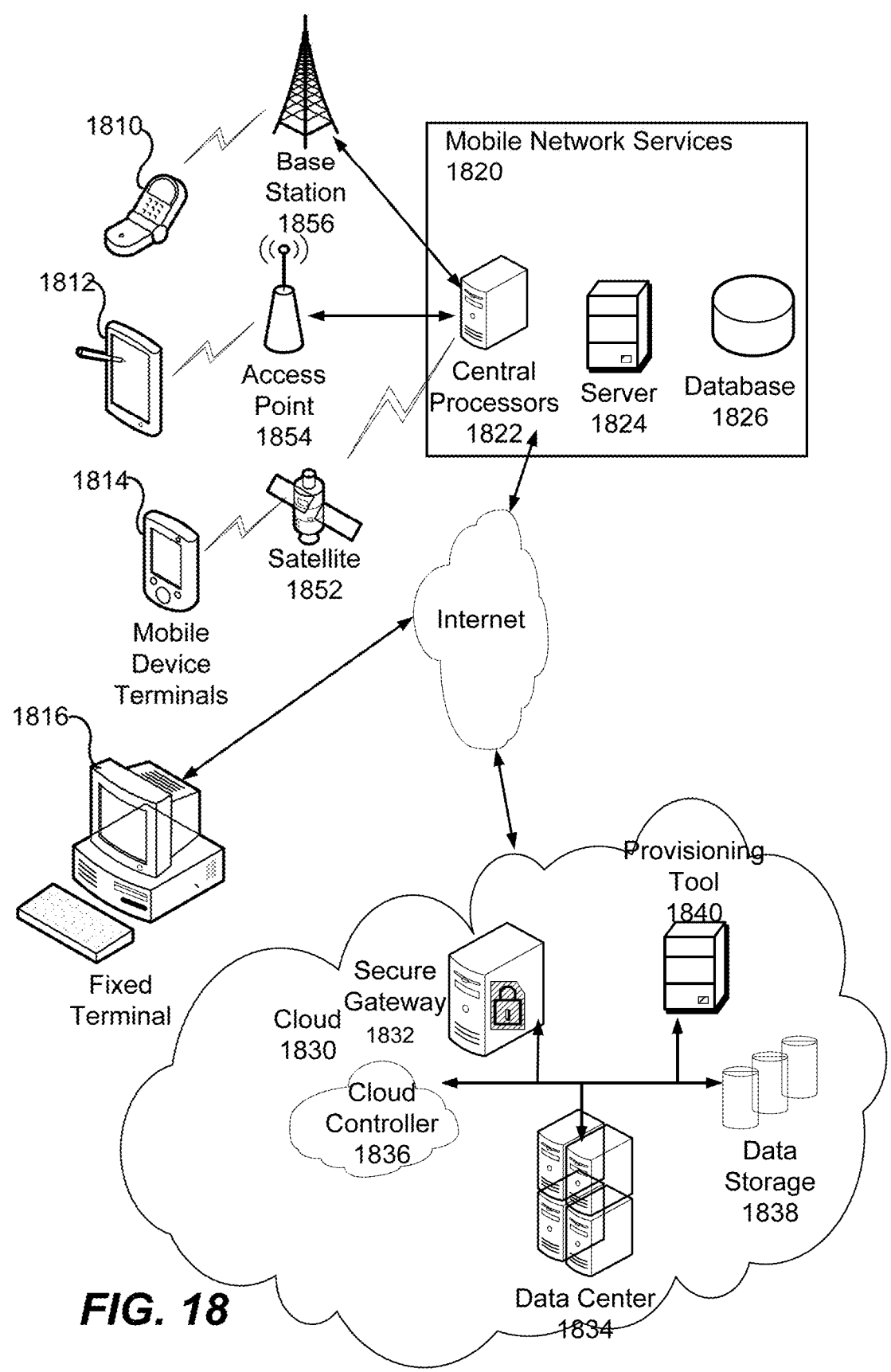
FIG. 18 is a diagram showing example distributed components in accordance with some implementations.

The functions and features described herein may also be executed by various distributed components of a system. For example, one or more processors may execute these system functions, wherein the processors are distributed across multiple components communicating in a network. The distributed components may include one or more client and server machines, which may share processing, as shown on FIG. 18, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits configured to execute program code and/or computer instructions to execute the functions, processes and algorithms described herein. Additionally, an implementation may be performed on modules or hardware not identical to those described. Accordingly, other implementations are within the scope that may be claimed.

The invention claimed is:

1. A field programmable gate array virtualization platform comprising:
   a network controller configured to provide an interface to an external network;
   a plurality of reconfigurable virtualized field programmable gate arrays (vFPGA), wherein each vFPGA is configured to be directly attached to a network via the network controller so as to appear on the network as an independent compute resource to other resources on the network;
   a static logic section coupled to the network controller, wherein the static logic section includes a clock management section, a routing arbiter, and a reconfiguration management unit,
   wherein the clock management section generates controllable clock domains for each vFPGA,
   wherein the routing arbiter routes data from the network controller to a vFPGA through two AXI interconnects, wherein a first AXI interconnect reads from an rx-Async buffer and routes to the vFPGA, wherein a second AXI interconnect reads from the vFPGA and forwards to a tx-Async buffer;
   wherein the reconfiguration management unit includes an internal reconfiguration access port (ICAP), has a dedicated MAC/IP address and is configured to download a user design at runtime to one or more vFPGAs, receive partial bitstreams over a network to reconfigure one or more vFPGA, and freeze vFPGA I/O interfaces during configuration or reconfiguration;
   each vFPGA including
   a wrapper, wherein the wrapper includes a custom interface for the user design that provides data, control, clocking signals and logic for coupling the user design to the static logic section, wherein the custom interface includes a description file, wherein the description file is an extensible mark-up language (XML) file; and
   wherein each vFPGA includes a plurality of physical connections which are reconfigured when the user design is received.

2. The field programmable gate array virtualization platform of claim 1, further comprising:
   a wrapper generator, wherein each wrapper is generated by the wrapper generator based on a description file of inputs and outputs of a respective user design.

3. The field programmable gate array virtualization platform of claim 1, wherein the static logic section presents one or more vFPGAs as a server, each with a separate MAC/IP.

4. The field programmable gate array virtualization platform of claim 1, wherein the static logic section presents the reconfiguration management unit as a separate server.

5. The field programmable gate array virtualization platform of claim 1, wherein the network controller includes a transmission control protocol data link, network, and session layers of an OSI network stack.

6. The field programmable gate array virtualization platform of claim 1, wherein the network controller establishes sessions between vFPGAs and respective clients, and wherein the network controller ensures data ordering and correctness.

7. The field programmable gate array virtualization platform of claim 1, wherein the network controller is configured to receive user data, deliver the user data to the static logic section, and transmit results back to a user associated with the user data.

8. The field programmable gate array virtualization platform of claim 1, wherein the network controller is integrated with the static logic section.

9. The field programmable gate array virtualization platform of claim 1, wherein the network controller is external to the field programmable gate array virtualization platform.

10. The field programmable gate array virtualization platform of claim 1, wherein a single network controller is shared among a plurality of vFPGAs.

11. The field programmable gate array virtualization platform of claim 1, wherein a network controller is provided per vFPGA.

12. The field programmable gate array virtualization platform of claim 1, wherein the static logic section includes data routers configured to route data between the network controller and one or more vFPGA.

13. The field programmable gate array virtualization platform of claim 1, wherein the reconfiguration management unit includes a wrapper.

* * * * *